(12) United States Patent
Noyes

(10) Patent No.: US 9,779,845 B2
(45) Date of Patent: Oct. 3, 2017

(54) PRIMARY VOLTAIC SOURCES INCLUDING NANOFIBER SCHOTTKY BARRIER ARRAYS AND METHODS OF FORMING SAME

(71) Applicant: Seerstone LLC, Provo, UT (US)

(72) Inventor: Dallas B. Noyes, Provo, UT (US)

(73) Assignee: Seerstone LLC, Provo, UT (US)

( * ) Notice: Subject to any disclaimer, the term of this patent is extended or adjusted under 35 U.S.C. 154(b) by 966 days.

(21) Appl. No.: 13/943,993

(22) Filed: Jul. 17, 2013

(65) Prior Publication Data
US 2014/0021827 A1 Jan. 23, 2014

Related U.S. Application Data

(60) Provisional application No. 61/672,885, filed on Jul. 18, 2012.

(51) Int. Cl.
*G21H 1/06* (2006.01)
*H01L 29/66* (2006.01)
(Continued)

(52) U.S. Cl.
CPC .......... *G21H 1/06* (2013.01); *H01L 29/0676* (2013.01); *H01L 29/66143* (2013.01);
(Continued)

(58) Field of Classification Search
CPC .. G21H 1/06; G21H 1/00; G21H 1/02; G21H 1/04; B82Y 10/00; H01L 29/0676;
(Continued)

(56) References Cited

U.S. PATENT DOCUMENTS 1,478,730 A 12/1923 Brownlee
1,735,925 A 11/1929 Jaeger
(Continued)

FOREIGN PATENT DOCUMENTS

EP 0945402 A1 9/1999
EP 2186931 A1 5/2010
(Continued)

OTHER PUBLICATIONS

Abatzoglou, Nicolas et al., "The use of catalytic reforming reactions for C02 sequestration as carbon nanotubes," Proceedings of the 2006 IASME/WSEAS International Conference on Energy & Environmental Systems, Chalkida, Greece, May 8-10, 2006 (pp. 21-26) (available at: http://www.wseas.us/e-library/conferences/2006evia/papers/516-19 3.pdf).

(Continued)

*Primary Examiner* — Quyen Leung
*Assistant Examiner* — Eric Johnson
(74) *Attorney, Agent, or Firm* — TraskBritt P.C.

(57) ABSTRACT

Primary voltaic sources include nanofiber Schottky barrier arrays and a radioactive source including at least one radioactive element configured to emit radioactive particles. The arrays have a semiconductor component and a metallic component joined at a metal-semiconductor junction. The radioactive source is positioned proximate to the arrays such that at least a portion of the radioactive particles impinge on the arrays to produce a flow of electrons across the metal-semiconductor junction. Methods of producing voltaic sources include reacting at least one carbon oxide and a reducing agent in the presence of a substrate comprising a catalyst to form a solid carbon product over the substrate. Material is disposed over at least a portion of the solid carbon product to form a nanofiber Schottky barrier array. A radioactive source is disposed adjacent the nanofiber Schottky barrier array.

21 Claims, 8 Drawing Sheets

(51) Int. Cl.
  *H01L 29/06*  (2006.01)
  *B82Y 15/00*  (2011.01)
  *H01L 29/47*  (2006.01)

(52) U.S. Cl.
  CPC ............... *B82Y 15/00* (2013.01); *H01L 29/47* (2013.01); *Y10S 322/00* (2013.01)

(58) Field of Classification Search
  CPC ........... H01L 29/66143; H01L 21/0435; H01L 21/0495; H01L 21/28537; H01L 21/28581
  USPC .................... 310/301–305; 977/948; 438/570
  See application file for complete search history.

(56) References Cited

U.S. PATENT DOCUMENTS

| | | |
|---|---|---|
| 1,746,464 A | 2/1930 | Fischer et al. |
| 1,964,744 A | 7/1934 | Odell |
| 2,404,869 A | 7/1946 | Sorrentino |
| 2,429,980 A | 11/1947 | Allinson |
| 2,440,424 A | 4/1948 | Wiegand et al. |
| 2,745,973 A | 5/1956 | Rappaport |
| 2,796,331 A | 6/1957 | Kauffman et al. |
| 2,800,616 A | 7/1957 | Becker |
| 2,811,653 A | 10/1957 | Moore |
| 2,819,414 A | 1/1958 | Sherwood et al. |
| 2,837,666 A | 6/1958 | Linder |
| 2,976,433 A | 3/1961 | Rappaport et al. |
| 3,094,634 A | 6/1963 | Rappaport |
| 3,172,774 A | 3/1965 | Diefendorf |
| 3,249,830 A | 5/1966 | Adany |
| 3,378,345 A | 4/1968 | Bourdeau et al. |
| 3,634,999 A | 1/1972 | Howard et al. |
| 3,714,474 A | 1/1973 | Hoff |
| 3,846,478 A | 11/1974 | Cummins |
| 3,905,748 A | 9/1975 | Cairo et al. |
| 4,024,420 A | 5/1977 | Anthony et al. |
| 4,126,000 A | 11/1978 | Funk |
| 4,197,281 A | 4/1980 | Muenger |
| 4,200,554 A | 4/1980 | Lauder |
| 4,602,477 A | 7/1986 | Lucadamo et al. |
| 4,628,143 A | 12/1986 | Brotz |
| 4,663,230 A | 5/1987 | Tennent |
| 4,710,483 A | 12/1987 | Burk et al. |
| 4,725,346 A | 2/1988 | Joshi |
| 4,727,207 A | 2/1988 | Paparizos et al. |
| 4,746,458 A | 5/1988 | Brotz |
| 4,900,368 A | 2/1990 | Brotz |
| 5,008,579 A | 4/1991 | Conley et al. |
| 5,021,139 A | 6/1991 | Hartig et al. |
| 5,082,505 A | 1/1992 | Cota et al. |
| 5,122,332 A | 6/1992 | Russell |
| 5,133,190 A | 7/1992 | Abdelmalek |
| 5,149,584 A | 9/1992 | Baker et al. |
| 5,187,030 A | 2/1993 | Firmin et al. |
| 5,260,621 A | 11/1993 | Little et al. |
| 5,396,141 A | 3/1995 | Jantz |
| 5,413,866 A | 5/1995 | Baker et al. |
| 5,456,897 A | 10/1995 | Moy et al. |
| 5,526,374 A | 6/1996 | Uebber |
| 5,531,424 A | 7/1996 | Whipp |
| 5,569,635 A | 10/1996 | Moy et al. |
| 5,572,544 A | 11/1996 | Mathur et al. |
| 5,578,543 A | 11/1996 | Tennent et al. |
| 5,589,152 A | 12/1996 | Tennent et al. |
| 5,624,542 A | 4/1997 | Shen et al. |
| 5,641,466 A | 6/1997 | Ebbesen et al. |
| 5,648,056 A | 7/1997 | Tanaka |
| 5,650,370 A | 7/1997 | Tennent et al. |
| 5,691,054 A | 11/1997 | Tennent et al. |
| 5,707,916 A | 1/1998 | Snyder et al. |
| 5,726,116 A | 3/1998 | Moy et al. |
| 5,747,161 A | 5/1998 | Iijima |
| 5,780,101 A | 7/1998 | Nolan et al. |
| 5,859,484 A | 1/1999 | Mannik et al. |
| 5,877,110 A | 3/1999 | Snyder et al. |
| 5,910,238 A | 6/1999 | Cable et al. |
| 5,965,267 A | 10/1999 | Nolan et al. |
| 5,997,832 A | 12/1999 | Lieber et al. |
| 6,099,965 A | 8/2000 | Tennent et al. |
| 6,159,892 A | 12/2000 | Moy et al. |
| 6,183,714 B1 | 2/2001 | Smalley et al. |
| 6,203,814 B1 | 3/2001 | Fisher et al. |
| 6,221,330 B1 | 4/2001 | Moy et al. |
| 6,232,706 B1 | 5/2001 | Dai et al. |
| 6,239,057 B1 | 5/2001 | Ichikawa et al. |
| 6,261,532 B1 | 7/2001 | Ono |
| 6,262,129 B1 | 7/2001 | Murray et al. |
| 6,294,144 B1 | 9/2001 | Moy et al. |
| 6,333,016 B1 | 12/2001 | Resasco et al. |
| 6,346,189 B1 | 2/2002 | Dai et al. |
| 6,361,861 B2 | 3/2002 | Gao |
| 6,375,917 B1 | 4/2002 | Mandeville et al. |
| 6,413,487 B1 | 7/2002 | Resasco et al. |
| 6,423,288 B2 | 7/2002 | Mandeville et al. |
| 6,426,442 B1 | 7/2002 | Ichikawa et al. |
| 6,465,813 B2 | 10/2002 | Ihm |
| 6,518,218 B1 | 2/2003 | Sun et al. |
| 6,596,101 B2 | 7/2003 | Weihs et al. |
| 6,645,455 B2 | 11/2003 | Margrave et al. |
| 6,683,783 B1 | 1/2004 | Liu et al. |
| 6,686,311 B2 | 2/2004 | Sun et al. |
| 6,692,717 B1 | 2/2004 | Smalley et al. |
| 6,713,519 B2 | 3/2004 | Wang et al. |
| 6,749,827 B2 | 6/2004 | Smalley et al. |
| 6,761,870 B1 | 7/2004 | Smalley et al. |
| 6,790,425 B1 | 9/2004 | Smalley et al. |
| 6,800,369 B2 | 10/2004 | Gimzewski et al. |
| 6,827,918 B2 | 12/2004 | Margrave et al. |
| 6,827,919 B1 | 12/2004 | Moy et al. |
| 6,835,330 B2 | 12/2004 | Nishino et al. |
| 6,835,366 B1 | 12/2004 | Margrave et al. |
| 6,841,139 B2 | 1/2005 | Margrave et al. |
| 6,843,843 B2 | 1/2005 | Takahashi et al. |
| 6,855,301 B1 | 2/2005 | Rich et al. |
| 6,855,593 B2 | 2/2005 | Andoh |
| 6,875,412 B2 | 4/2005 | Margrave et al. |
| 6,890,986 B2 | 5/2005 | Pruett |
| 6,899,945 B2 | 5/2005 | Smalley et al. |
| 6,905,544 B2 | 6/2005 | Setoguchi et al. |
| 6,913,740 B2 | 7/2005 | Polverejan et al. |
| 6,913,789 B2 | 7/2005 | Smalley et al. |
| 6,916,434 B2 | 7/2005 | Nishino et al. |
| 6,919,064 B2 | 7/2005 | Resasco et al. |
| 6,936,233 B2 | 8/2005 | Smalley et al. |
| 6,949,237 B2 | 9/2005 | Smalley et al. |
| 6,955,800 B2 | 10/2005 | Resasco et al. |
| 6,960,389 B2 | 11/2005 | Tennent et al. |
| 6,962,685 B2 | 11/2005 | Sun |
| 6,979,709 B2 | 12/2005 | Smalley et al. |
| 6,986,876 B2 | 1/2006 | Smalley et al. |
| 6,998,358 B2 | 2/2006 | French et al. |
| 7,011,771 B2 | 3/2006 | Gao et al. |
| 7,041,620 B2 | 5/2006 | Smalley et al. |
| 7,045,108 B2 | 5/2006 | Jiang et al. |
| 7,048,999 B2 | 5/2006 | Smalley et al. |
| 7,052,668 B2 | 5/2006 | Smalley et al. |
| 7,067,098 B2 | 6/2006 | Colbert et al. |
| 7,071,406 B2 | 7/2006 | Smalley et al. |
| 7,074,379 B2 | 7/2006 | Moy et al. |
| 7,094,385 B2 | 8/2006 | Beguin et al. |
| 7,094,386 B2 | 8/2006 | Resasco et al. |
| 7,094,679 B1 | 8/2006 | Li et al. |
| 7,097,820 B2 | 8/2006 | Colbert et al. |
| 7,105,596 B2 | 9/2006 | Smalley et al. |
| 7,125,534 B1 | 10/2006 | Smalley et al. |
| 7,132,062 B1 | 11/2006 | Howard |
| 7,135,159 B2 | 11/2006 | Shaffer et al. |
| 7,135,160 B2 | 11/2006 | Yang et al. |
| 7,150,864 B1 | 12/2006 | Smalley et al. |
| 7,157,068 B2 | 1/2007 | Li et al. |
| 7,160,532 B2 | 1/2007 | Liu et al. |
| 7,169,329 B2 | 1/2007 | Wong et al. |
| 7,201,887 B2 | 4/2007 | Smalley et al. |

(56) References Cited

U.S. PATENT DOCUMENTS

| | | |
|---|---|---|
| 7,204,970 B2 | 4/2007 | Smalley et al. |
| 7,205,069 B2 | 4/2007 | Smalley et al. |
| 7,212,147 B2 | 5/2007 | Messano |
| 7,214,360 B2 | 5/2007 | Chen et al. |
| 7,250,148 B2 | 7/2007 | Yang et al. |
| 7,270,795 B2 | 9/2007 | Kawakami et al. |
| 7,291,318 B2 | 11/2007 | Sakurabayashi et al. |
| 7,338,648 B2 | 3/2008 | Harutyunyan et al. |
| 7,365,289 B2 | 4/2008 | Wilkes et al. |
| 7,374,793 B2 | 5/2008 | Furukawa et al. |
| 7,390,477 B2 | 6/2008 | Smalley et al. |
| 7,396,798 B2 | 7/2008 | Ma et al. |
| 7,408,186 B2 | 8/2008 | Merkulov et al. |
| 7,410,628 B2 | 8/2008 | Bening et al. |
| 7,413,723 B2 | 8/2008 | Niu et al. |
| 7,452,828 B2 | 11/2008 | Hirakata et al. |
| 7,459,137 B2 | 12/2008 | Tour et al. |
| 7,459,138 B2 | 12/2008 | Resasco et al. |
| 7,473,873 B2 | 1/2009 | Biris et al. |
| 7,510,695 B2 | 3/2009 | Smalley et al. |
| 7,527,780 B2 | 5/2009 | Margrave et al. |
| 7,563,427 B2 | 7/2009 | Wei et al. |
| 7,563,428 B2 | 7/2009 | Resasco et al. |
| 7,569,203 B2 | 8/2009 | Fridman et al. |
| 7,572,426 B2 | 8/2009 | Strano et al. |
| 7,585,483 B2 | 9/2009 | Edwin et al. |
| 7,601,322 B2 | 10/2009 | Huang |
| 7,611,579 B2 | 11/2009 | Lashmore et al. |
| 7,615,204 B2 | 11/2009 | Ajayan et al. |
| 7,618,599 B2 | 11/2009 | Kim et al. |
| 7,622,059 B2 | 11/2009 | Bordere et al. |
| 7,632,569 B2 | 12/2009 | Smalley et al. |
| 7,645,933 B2 | 1/2010 | Narkis et al. |
| 7,655,302 B2 | 2/2010 | Smalley et al. |
| 7,670,510 B2 | 3/2010 | Wong et al. |
| 7,700,065 B2 | 4/2010 | Fujioka et al. |
| 7,704,481 B2 | 4/2010 | Higashi et al. |
| 7,718,283 B2 | 5/2010 | Raffaelle et al. |
| 7,719,265 B2 | 5/2010 | Harutyunyan et al. |
| 7,731,930 B2 | 6/2010 | Taki et al. |
| 7,736,741 B2 | 6/2010 | Maruyama et al. |
| 7,740,825 B2 | 6/2010 | Tohji et al. |
| 7,749,477 B2 | 7/2010 | Jiang et al. |
| 7,754,182 B2 | 7/2010 | Jiang et al. |
| 7,772,447 B2 | 8/2010 | Iaccino et al. |
| 7,780,939 B2 | 8/2010 | Margrave et al. |
| 7,785,558 B2 | 8/2010 | Hikata |
| 7,790,228 B2 | 9/2010 | Suekane et al. |
| 7,794,690 B2 | 9/2010 | Abatzoglou et al. |
| 7,794,797 B2 | 9/2010 | Vasenkov |
| 7,799,246 B2 | 9/2010 | Bordere et al. |
| 7,811,542 B1 | 10/2010 | McElrath et al. |
| 7,824,648 B2 | 11/2010 | Jiang et al. |
| 7,837,968 B2 | 11/2010 | Chang et al. |
| 7,838,843 B2 | 11/2010 | Kawakami et al. |
| 7,842,271 B2 | 11/2010 | Petrik |
| 7,854,945 B2 | 12/2010 | Fischer et al. |
| 7,854,991 B2 | 12/2010 | Hata et al. |
| 7,858,648 B2 | 12/2010 | Bianco et al. |
| 7,871,591 B2 | 1/2011 | Harutyunyan et al. |
| 7,883,995 B2 | 2/2011 | Mitchell et al. |
| 7,887,774 B2 | 2/2011 | Strano et al. |
| 7,888,543 B2 | 2/2011 | Iaccino et al. |
| 7,897,209 B2 | 3/2011 | Shibuya et al. |
| 7,901,654 B2 | 3/2011 | Harutyunyan |
| 7,906,095 B2 | 3/2011 | Kawabata |
| 7,919,065 B2 | 4/2011 | Pedersen et al. |
| 7,923,403 B2 | 4/2011 | Ma et al. |
| 7,923,615 B2 | 4/2011 | Silvy et al. |
| 7,932,419 B2 | 4/2011 | Liu et al. |
| 7,947,245 B2 | 5/2011 | Tada et al. |
| 7,951,351 B2 | 5/2011 | Ma et al. |
| 7,964,174 B2 | 6/2011 | Dubin et al. |
| 7,981,396 B2 | 7/2011 | Harutyunyan |
| 7,988,861 B2 | 8/2011 | Pham-Huu et al. |
| 7,993,594 B2 | 8/2011 | Wei et al. |
| 8,012,447 B2 | 9/2011 | Harutyunyan et al. |
| 8,017,282 B2 | 9/2011 | Choi et al. |
| 8,017,892 B2 | 9/2011 | Biris et al. |
| 8,038,908 B2 | 10/2011 | Hirai et al. |
| 8,114,518 B2 | 2/2012 | Hata et al. |
| 8,138,384 B2 | 3/2012 | Iaccino et al. |
| 8,173,096 B2 | 5/2012 | Chang et al. |
| 8,178,049 B2 | 5/2012 | Shiraki et al. |
| 8,226,902 B2 | 7/2012 | Jang et al. |
| 8,314,044 B2 | 11/2012 | Jangbarwala |
| 2001/0009119 A1 | 7/2001 | Murray et al. |
| 2002/0054849 A1 | 5/2002 | Baker et al. |
| 2002/0102193 A1 | 8/2002 | Smalley et al. |
| 2002/0102196 A1 | 8/2002 | Smalley et al. |
| 2002/0127169 A1 | 9/2002 | Smalley et al. |
| 2002/0127170 A1 | 9/2002 | Hong et al. |
| 2002/0172767 A1 | 11/2002 | Grigorian et al. |
| 2003/0059364 A1 | 3/2003 | Prilutskiy |
| 2003/0147802 A1 | 8/2003 | Smalley et al. |
| 2004/0053440 A1 | 3/2004 | Lai et al. |
| 2004/0070009 A1 | 4/2004 | Resasco et al. |
| 2004/0105807 A1 | 6/2004 | Fan et al. |
| 2004/0111968 A1 | 6/2004 | Day et al. |
| 2004/0151654 A1 | 8/2004 | Wei et al. |
| 2004/0194705 A1 | 10/2004 | Dai et al. |
| 2004/0197260 A1 | 10/2004 | Resasco et al. |
| 2004/0202603 A1 | 10/2004 | Fischer et al. |
| 2004/0234445 A1 | 11/2004 | Serp et al. |
| 2004/0247503 A1 | 12/2004 | Hyeon |
| 2004/0265212 A1 | 12/2004 | Varadan et al. |
| 2005/0002850 A1 | 1/2005 | Niu et al. |
| 2005/0002851 A1 | 1/2005 | McElrath et al. |
| 2005/0025695 A1 | 2/2005 | Pradhan |
| 2005/0042162 A1 | 2/2005 | Resasco et al. |
| 2005/0046322 A1 | 3/2005 | Kim et al. |
| 2005/0074392 A1 | 4/2005 | Yang et al. |
| 2005/0079118 A1 | 4/2005 | Maruyama et al. |
| 2005/0100499 A1 | 5/2005 | Oya et al. |
| 2005/0176990 A1 | 8/2005 | Coleman et al. |
| 2005/0244325 A1 | 11/2005 | Nam et al. |
| 2005/0276743 A1 | 12/2005 | Lacombe et al. |
| 2006/0013757 A1 | 1/2006 | Edwin et al. |
| 2006/0032330 A1 | 2/2006 | Sato |
| 2006/0045837 A1 | 3/2006 | Nishimura |
| 2006/0078489 A1 | 4/2006 | Harutyunyan et al. |
| 2006/0104884 A1 | 5/2006 | Shaffer et al. |
| 2006/0104886 A1 | 5/2006 | Wilson |
| 2006/0104887 A1 | 5/2006 | Fujioka et al. |
| 2006/0133990 A1 | 6/2006 | Hyeon et al. |
| 2006/0141346 A1 | 6/2006 | Gordon et al. |
| 2006/0165988 A1 | 7/2006 | Chiang et al. |
| 2006/0191835 A1 | 8/2006 | Petrik et al. |
| 2006/0196537 A1* | 9/2006 | Narkis ............... B82Y 10/00 136/255 |
| 2006/0199770 A1 | 9/2006 | Bianco et al. |
| 2006/0204426 A1 | 9/2006 | Akins et al. |
| 2006/0225534 A1 | 10/2006 | Swihart et al. |
| 2006/0239890 A1 | 10/2006 | Chang et al. |
| 2006/0239891 A1 | 10/2006 | Niu et al. |
| 2006/0245996 A1 | 11/2006 | Xie et al. |
| 2006/0275956 A1 | 12/2006 | Konesky |
| 2007/0003470 A1 | 1/2007 | Smalley et al. |
| 2007/0020168 A1 | 1/2007 | Asmussen et al. |
| 2007/0031320 A1 | 2/2007 | Jiang et al. |
| 2007/0080605 A1 | 4/2007 | Chandrashekhar et al. |
| 2007/0116631 A1 | 5/2007 | Li et al. |
| 2007/0148962 A1 | 6/2007 | Kauppinen et al. |
| 2007/0149392 A1 | 6/2007 | Ku et al. |
| 2007/0183959 A1 | 8/2007 | Charlier et al. |
| 2007/0189953 A1 | 8/2007 | Bai et al. |
| 2007/0207318 A1 | 9/2007 | Jin et al. |
| 2007/0209093 A1 | 9/2007 | Tohji et al. |
| 2007/0253886 A1 | 11/2007 | Abatzoglou et al. |
| 2007/0264187 A1 | 11/2007 | Harutyunyan et al. |
| 2007/0280876 A1 | 12/2007 | Tour et al. |
| 2007/0281087 A1 | 12/2007 | Harutyunyan et al. |
| 2008/0003170 A1 | 1/2008 | Buchholz et al. |
| 2008/0003182 A1 | 1/2008 | Wilson et al. |

(56) References Cited

U.S. PATENT DOCUMENTS

| | | |
|---|---|---|
| 2008/0008760 A1 | 1/2008 | Bianco et al. |
| 2008/0014654 A1 | 1/2008 | Weisman et al. |
| 2008/0095695 A1 | 4/2008 | Shanov et al. |
| 2008/0118426 A1 | 5/2008 | Li et al. |
| 2008/0160312 A1 | 7/2008 | Furukawa et al. |
| 2008/0169061 A1 | 7/2008 | Tour et al. |
| 2008/0176069 A1 | 7/2008 | Ma et al. |
| 2008/0182155 A1 | 7/2008 | Choi et al. |
| 2008/0193367 A1 | 8/2008 | Kalck et al. |
| 2008/0217588 A1 | 9/2008 | Arnold et al. |
| 2008/0226538 A1 | 9/2008 | Rumpf et al. |
| 2008/0233402 A1 | 9/2008 | Carlson et al. |
| 2008/0239620 A1 | 10/2008 | Min et al. |
| 2008/0260618 A1 | 10/2008 | Kawabata |
| 2008/0274277 A1 | 11/2008 | Rashidi et al. |
| 2008/0279753 A1 | 11/2008 | Harutyunyan |
| 2008/0280136 A1 | 11/2008 | Zachariah et al. |
| 2008/0296537 A1 | 12/2008 | Gordon et al. |
| 2008/0299029 A1 | 12/2008 | Grosboll et al. |
| 2008/0305028 A1 | 12/2008 | McKeigue et al. |
| 2008/0305029 A1 | 12/2008 | McKeigue et al. |
| 2008/0305030 A1 | 12/2008 | McKeigue et al. |
| 2008/0318357 A1 | 12/2008 | Raffaelle et al. |
| 2009/0001326 A1 | 1/2009 | Sato et al. |
| 2009/0004075 A1 | 1/2009 | Chung et al. |
| 2009/0011128 A1 | 1/2009 | Oshima et al. |
| 2009/0035569 A1 | 2/2009 | Gonzalez Moral et al. |
| 2009/0056802 A1 | 3/2009 | Rabani |
| 2009/0074634 A1 | 3/2009 | Tada et al. |
| 2009/0081454 A1 | 3/2009 | Axmann et al. |
| 2009/0087371 A1 | 4/2009 | Jang et al. |
| 2009/0087622 A1 | 4/2009 | Busnaina et al. |
| 2009/0124705 A1 | 5/2009 | Meyer et al. |
| 2009/0134363 A1 | 5/2009 | Bordere et al. |
| 2009/0136413 A1 | 5/2009 | Li et al. |
| 2009/0140215 A1 | 6/2009 | Buchholz et al. |
| 2009/0186223 A1 | 7/2009 | Saito et al. |
| 2009/0191352 A1 | 7/2009 | DuFaux et al. |
| 2009/0203519 A1 | 8/2009 | Abatzoglou et al. |
| 2009/0208388 A1 | 8/2009 | McKeigue et al. |
| 2009/0208708 A1 | 8/2009 | Wei et al. |
| 2009/0220392 A1 | 9/2009 | McKeigue et al. |
| 2009/0226704 A1 | 9/2009 | Kauppinen et al. |
| 2009/0257945 A1 | 10/2009 | Biris et al. |
| 2009/0286084 A1 | 11/2009 | Tennent et al. |
| 2009/0286675 A1 | 11/2009 | Wei et al. |
| 2009/0294753 A1 | 12/2009 | Hauge et al. |
| 2009/0297846 A1 | 12/2009 | Hata et al. |
| 2009/0297847 A1 | 12/2009 | Kim et al. |
| 2009/0301349 A1 | 12/2009 | Afzali-Ardakani et al. |
| 2010/0004468 A1 | 1/2010 | Wong et al. |
| 2010/0009204 A1 | 1/2010 | Noguchi et al. |
| 2010/0028735 A1 | 2/2010 | Basset et al. |
| 2010/0034725 A1 | 2/2010 | Harutyunyan |
| 2010/0062229 A1 | 3/2010 | Hata et al. |
| 2010/0065776 A1 | 3/2010 | Han et al. |
| 2010/0074811 A1 | 3/2010 | McKeigue et al. |
| 2010/0081568 A1 | 4/2010 | Bedworth |
| 2010/0104808 A1 | 4/2010 | Fan et al. |
| 2010/0129654 A1 | 5/2010 | Jiang et al. |
| 2010/0132259 A1 | 6/2010 | Haque |
| 2010/0132883 A1 | 6/2010 | Burke et al. |
| 2010/0150810 A1 | 6/2010 | Yoshida et al. |
| 2010/0158788 A1 | 6/2010 | Kim et al. |
| 2010/0159222 A1 | 6/2010 | Hata et al. |
| 2010/0160155 A1 | 6/2010 | Liang |
| 2010/0167053 A1 | 7/2010 | Sung et al. |
| 2010/0173037 A1 | 7/2010 | Jiang et al. |
| 2010/0173153 A1 | 7/2010 | Hata et al. |
| 2010/0196249 A1 | 8/2010 | Hata et al. |
| 2010/0196600 A1 | 8/2010 | Shibuya et al. |
| 2010/0209696 A1 | 8/2010 | Seals et al. |
| 2010/0213419 A1 | 8/2010 | Jiang et al. |
| 2010/0221173 A1 | 9/2010 | Tennent et al. |
| 2010/0222432 A1 | 9/2010 | Hua |
| 2010/0226848 A1 | 9/2010 | Nakayama et al. |
| 2010/0230642 A1 | 9/2010 | Kim et al. |
| 2010/0233518 A1* | 9/2010 | Kwon ............ G21H 1/00 429/7 |
| 2010/0239489 A1 | 9/2010 | Harutyunyan et al. |
| 2010/0254860 A1 | 10/2010 | Shiraki et al. |
| 2010/0254886 A1 | 10/2010 | McElrath et al. |
| 2010/0260927 A1 | 10/2010 | Gordon et al. |
| 2010/0278717 A1 | 11/2010 | Suzuki et al. |
| 2010/0298125 A1 | 11/2010 | Kim et al. |
| 2010/0301278 A1 | 12/2010 | Hirai et al. |
| 2010/0303675 A1 | 12/2010 | Suekane et al. |
| 2010/0316556 A1 | 12/2010 | Wei et al. |
| 2010/0316562 A1 | 12/2010 | Carruthers et al. |
| 2010/0317790 A1 | 12/2010 | Jang et al. |
| 2010/0320437 A1 | 12/2010 | Gordon et al. |
| 2011/0008617 A1 | 1/2011 | Hata et al. |
| 2011/0014368 A1 | 1/2011 | Vasenkov |
| 2011/0020211 A1 | 1/2011 | Jayatissa |
| 2011/0024697 A1 | 2/2011 | Biris et al. |
| 2011/0027162 A1 | 2/2011 | Steiner, III et al. |
| 2011/0027163 A1 | 2/2011 | Shinohara et al. |
| 2011/0033367 A1 | 2/2011 | Riehl et al. |
| 2011/0039124 A1 | 2/2011 | Ikeuchi et al. |
| 2011/0053020 A1 | 3/2011 | Norton et al. |
| 2011/0053050 A1 | 3/2011 | Lim et al. |
| 2011/0060087 A1 | 3/2011 | Noguchi et al. |
| 2011/0079791 A1* | 4/2011 | Chandrashekhar ...... G21H 1/02 257/77 |
| 2011/0085961 A1 | 4/2011 | Noda et al. |
| 2011/0110842 A1 | 5/2011 | Haddon |
| 2011/0117365 A1 | 5/2011 | Hata et al. |
| 2011/0120138 A1 | 5/2011 | Gaiffi et al. |
| 2011/0150746 A1 | 6/2011 | Khodadadi et al. |
| 2011/0155964 A1 | 6/2011 | Arnold et al. |
| 2011/0158892 A1 | 6/2011 | Yamaki |
| 2011/0171109 A1 | 7/2011 | Petrik |
| 2011/0174145 A1 | 7/2011 | Ogrin et al. |
| 2011/0206469 A1 | 8/2011 | Furuyama et al. |
| 2011/0298071 A9 | 12/2011 | Spencer et al. |
| 2012/0034150 A1 | 2/2012 | Noyes |
| 2012/0083408 A1 | 4/2012 | Sato et al. |
| 2012/0107610 A1 | 5/2012 | Moravsky et al. |
| 2012/0137664 A1 | 6/2012 | Shawabkeh et al. |
| 2012/0148476 A1 | 6/2012 | Hata et al. |
| 2013/0154438 A1 | 6/2013 | Tan Xing Haw |
| 2014/0021827 A1 | 1/2014 | Noyes |
| 2014/0141248 A1 | 5/2014 | Noyes |
| 2014/0348739 A1 | 11/2014 | Denton et al. |
| 2015/0059527 A1 | 3/2015 | Noyes |
| 2015/0059571 A1 | 3/2015 | Denton et al. |
| 2015/0064092 A1 | 3/2015 | Noyes |
| 2015/0064096 A1 | 3/2015 | Noyes |
| 2015/0064097 A1 | 3/2015 | Noyes |
| 2015/0071846 A1 | 3/2015 | Noyes |
| 2015/0071848 A1 | 3/2015 | Denton et al. |
| 2015/0078982 A1 | 3/2015 | Noyes |

FOREIGN PATENT DOCUMENTS

| | | |
|---|---|---|
| EP | 2404869 A1 | 1/2012 |
| JP | 3339339 B2 | 10/2002 |
| JP | 2004517789 A | 6/2004 |
| JP | 2004360099 A | 12/2004 |
| JP | 2005075725 A | 3/2005 |
| JP | 2005532976 A | 11/2005 |
| JP | 2007191840 A | 8/2007 |
| KR | 1020050072056 A | 7/2005 |
| WO | 0230816 A1 | 4/2002 |
| WO | 03018474 A1 | 3/2003 |
| WO | 2004096704 A3 | 11/2005 |
| WO | 2005103348 A1 | 11/2005 |
| WO | 2006003482 A3 | 8/2006 |
| WO | 2007086909 A3 | 11/2007 |
| WO | 2007139097 A1 | 12/2007 |
| WO | 2007126412 A3 | 6/2008 |
| WO | 2009011984 A1 | 1/2009 |
| WO | 2006130150 A3 | 4/2009 |
| WO | 2009122139 A1 | 10/2009 |

(56) References Cited

FOREIGN PATENT DOCUMENTS

| | | |
|---|---|---|
| WO | 2009145959 A1 | 12/2009 |
| WO | 2010047439 A1 | 4/2010 |
| WO | 2010087903 A1 | 8/2010 |
| WO | 2010120581 A1 | 10/2010 |
| WO | 2011009071 A1 | 1/2011 |
| WO | 2011020568 A1 | 2/2011 |
| WO | 2011029144 A1 | 3/2011 |
| WO | 2010146169 A3 | 4/2011 |
| WO | 2010124258 A3 | 5/2011 |
| WO | 2011053192 A2 | 5/2011 |
| WO | 2013090274 A | 6/2013 |
| WO | 2013158155 A1 | 10/2013 |
| WO | 2013158156 A1 | 10/2013 |
| WO | 2013158157 A1 | 10/2013 |
| WO | 2013158158 A1 | 10/2013 |
| WO | 2013158159 A1 | 10/2013 |
| WO | 2013158160 A1 | 10/2013 |
| WO | 2013158438 A1 | 10/2013 |
| WO | 2013158439 A2 | 10/2013 |
| WO | 2013158441 A1 | 10/2013 |
| WO | 2013162650 A1 | 10/2013 |
| WO | 2014011206 A1 | 1/2014 |
| WO | 2014011631 A1 | 1/2014 |
| WO | 2014085378 A1 | 6/2014 |

OTHER PUBLICATIONS

Abatzoglou, Nicolas et al., "Green Diesel from Fischer-Tropsch Synthesis: Challenges and Hurdles," Proc. of the 3rd IASME/WSEAS Int. Conf. on Energy, Environment, Ecosystems and Sustainable Development, Agios Nikolaos, Greece, Jul. 24-26, 2007, pp. 223-232.
Baker, B. A. and G. D. Smith "Metal Dusting in a Laboratory Environment—Alloying Addition Effects," Special Metals Corporation, undated.
Baker, B. A. and G. D. Smith, "Alloy Solutions to Metal Dusting Problems in the PetroChemical Industry," Special Metals Corporation, undated.
Cha, S. I., et al., "Mechanical and electrical properties of cross•linked carbon nanotubes," Carbon 46 (2008) 482-488, Elsevier, Ltd.
Cheng, H.M. et al., "Large-scale and low-cost synthesis of single-walled carbon nanotubes by the catalytic pyrolysis of hydrocarbons," Applied Physics Letters 72:3282-3284, Jun. 22, 1998 (available at: http://carbon.imr.ac.cn/file/journai/1998/98_APL_72_3282-ChengH M.pdf).
Chun, Changmin, and Ramanarayanan, Trikur A., "Metal Dusting Corrosion of Metals and Alloys," 2007.
Chung, U.C., and W.S. Chung, "Mechanism on Growth of Carbon Nanotubes Using CO-H2 Gas Mixture," Materials Science Forum vols. 475-479 (2005) pp. 3551-3554.
Dai, et al., "Single-wall nanotubes produced by metal-catalyzed disproportionation of carbon monoxide," Chemical Physics Letters 260 (1996) 471-475, Elsevier.
Garmirian, James Edwin, "Carbon Deposition in a Bosch Process Using a Cobalt and Nickel Catalyst," PhD Dissertation, Massachusetts Institute of Technology, Mar. 1980, pp. 14-185.
Grobert, Nicole, "Carbon nanotubes—becoming clean," Materials Today, vol. 10, No. 1-2, Jan.-Feb. 2007, Elsevier, pp. 28-35.
Hata, Kenji, "From Highly Efficient Impurity-Free CNT Synthesis to DWNT forests, CNTsolids and Super-Capacitors," unknown date, unknown publisher, Research Center for Advanced Carbon Materials, National Institute of Advanced Industrial Science and Technology (AIST), Tsukuba, 305-8565, Japan, Feb. 27, 2007.
Hiraoka, Tatsuki, et al., "Synthesis of Single- and Double-Walled Carbon Nanotube Forests on Conducting Metal Foils," 9 J. Am. Chem. Soc. 2006, 128, 13338-13339, Sep. 22, 2006.
Holmes, et al.; A Carbon Dioxide Reduction Unit Using Bosch Reaction and Expendable Catalyst Cartridges; NASA; 1970; available at https://archive.org/details/nasa_techdoc_19710002858.

Huang, Z.P., et al., "Growth of highly oriented carbon nanotubes by plasma-enhanced hot filament chemical vapor deposition," Applied Physics Letters 73:3845-3847, Dec. 28, 1998.
"INCONEL® alloy 693-Excellent Resistance to Metal Dusting and High Temperature Corrosion" Special Metals Product Sheet, 2005.
Krestinin, A. V., et al. "Kinetics of Growth of Carbon Fibers on an Iron Catalyst in Methane Pyrolysis: A Measurement Procedure with the Use of an Optical Microscope," Kinetics and Catalysis, 2008, vol. 49, No. 1, pp. 68-78.
Lal, Archit, "Effect of Gas Composition and Carbon Activity on the Growth of Carbon Nanotubes," Masters Thesis, University of Florida, 2003.
Manning, Michael Patrick, "An Investigation of the Bosch Process," PhD Dissertation, Massachusetts Institute of Technology, Jan. 1976.
Unknown author, "Metal Dusting," unknown publisher, undated.
Unknown author, "Metal Dusting of reducing gas furnace HK40 tube," unknown publisher, undated.
Muller-Lorenz and Grabke, Coking by metal dusting of steels, 1999, Materials and Corrosion 50, 614-621 (1999).
Nasibulin, Albert G., et al., "An essential role of C02 and H20 during single-walled CNT synthesis from carbon monoxide," Chemical Physics Letters 417 (2005) 179-184.
Nasibulin, Albert G., et al., "Correlation between catalyst particle and single-walled carbon nanotube diameters," Carbon 43 (2005) 2251-2257.
Noordin, Mohamad and Kong Yong Liew, "Synthesis of Alumina Nanofibers and Composites," in Nanofibers, pp. 405-418 (Ashok Kumar, ed., 2010) ISBN 978-953-7619-86-2 (available at http://www.intechopen.com/books/nanofibers/synthesis-of-alumina•nanofibers-and-composites).
Pender, Mark J., et al., "Molecular and polymeric precursors to boron carbide nanofibers, nanocylinders, and nanoporous ceramics," Pure Appl. Chem., vol. 75, No. 9, pp. 1287-1294, 2003.
Ruckenstein, E. and H.Y. Wang, "Carbon Deposition and Catalytic Deactivation during C02 Reforming of CH4 over Co/?-A12O3 Catalysts," Journal of Catalysis, vol. 205, Issue 2, Jan. 25, 2002, pp. 289-293.
Sacco, Albert Jr., "An Investigation of the Reactions of Carbon Dioxide, Carbon Monoxide, Methane, Hydrogen, and Water over Iron, Iron Carbides, and Iron Oxides," PhD Dissertation, Massachusetts Institute of Technology, Jul. 1977, pp. 2, 15-234.
SAE 820875 Utilization of Ruthenium and Ruthenium-Iron Alloys as Bosch Process Catalysts. Jul. 19-21, 1982.
SAE 911451 Optimization of Bosch Reaction, Jul. 15-18, 1991.
Songsasen, Apisit and Paranchai Pairgreethaves, "Preparation of Carbon Nanotubes by Nickel Catalyzed Decomposition of Liquefied Petroleum Gas (LPG)," Kasetsart J. (Nat. Sci.) 35 : 354-359 (2001) (available at: http://kasetsartjournal.ku.ac.th/kuj_files/2008/A0804251023348734.pdf).
Szakalos, P., "Mechanisms and driving forces of metal dusting," Materials and Corrosion, 2003, 54, No. 10, pp. 752-762.
Tsai, Heng-Yi, et al., "A feasibility study of preparing carbon nanotubes by using a metal dusting process," Diamond & Related Materials 18 (2009) 324-327, Elsevier.
Wilson, Richard B., "Fundamental Investigation of the Bosch Reaction," PhD Dissertation, Massachusetts Institute of Technology, Jul. 1977, pp. 12,23, 37, 43, 44, 62, 70, 80, 83-88, 98.
Wei, et al. "The mass production of carbon nanotubes using a nano-agglomerate fluidized bed reactor: A multiscale space-time analysis," Powder Technology 183 (2008) 10-20, Elsevier.
XP-002719593 Thomson abstract. Sep. 30, 1987.
Zeng, Z., and Natesan, K., Relationship between the Growth of Carbon Nanofilaments and Metal Dusting Corrosion, 2005, Chem. Mater. 2005, 17, 3794-3801.
Bogue, Robert, Powering Tomorrow's Sensor: A Review of Technologies—Part 1, Sensor Review, 2010, pp. 182-186, vol. 30, No. 3.
Kavetsky et al., Chapter 2, Radioactive Materials, Ionizing Radiation Sources, and Radioluminescent Light Sources for Nuclear Batteries, Polymers, Phosphors, and Voltaics for Radioisotope Microbatteries, Edited by Bower et al., 2002, pp. 39-59.

(56) References Cited

OTHER PUBLICATIONS

Dresselhaus et al., Introduction to Carbon Materials Research, 2001, pp. 1-9.
Skulason, Egill, Metallic and Semiconducting Properties of Carbon Nanotubes, Modern Physics, Nov. 2005, slide presentation, 21 slides, available at https://notendur.hi.is//~egillsk/stuff/annad/Egill.Slides2.pdf, last visited Jul. 5, 2013.
Manasse et al., Schottky Barrier Betavoltaic Battery, IEEE Transactions on Nuclear Science, vol. NS-23, No. 1, Feb. 1976, pp. 860-870.
Singh, Jasprit, Semiconductor Devices, An Introduction, 1994, pp. 86-93, 253-269.
Singh, Jasprit, Semiconductor Devices, Basic Principles, Chapter 6, Semiconductor Junctions with Metals and Insulators, 2001, pp. 224-244, Wiley.
Tse, Anthony N., A Thesis submitted to the Faculty in partial fulfillment of the requirement for the degree of Doctor of Engineering, Thayer School of Engineering, Dartmouth College, Hanover, New Hampshire, Si-Au Schottky Barrier Nuclear Battery, Nov. 1972, pp. 31-57.

\* cited by examiner

PRIMARY VOLTAIC SOURCES INCLUDING NANOFIBER SCHOTTKY BARRIER ARRAYS AND METHODS OF FORMING SAME

CROSS-REFERENCE TO RELATED APPLICATION

This application claims the benefit of the filing date of U.S. Provisional Patent Application Ser. No. 61/672,885, filed Jul. 18, 2012, for "Primary Voltaic Sources Including Nanofiber Schottky Barrier Arrays and Methods of Forming Same," the disclosure of which is hereby incorporated herein in its entirety by this reference.

FIELD

Embodiments of the present disclosure relate to electrical power sources, in particular to power sources based on converting nuclear radiation to electrical power.

BACKGROUND

The following documents, each published in the name of Dallas B. Noyes, disclose background information hereto, and each is hereby incorporated herein in its entirety by this reference:
U.S. Patent Publication No. 2012/0034150 A1, published Feb. 9, 2012;
International Application No. PCT/US2013/000071, filed Mar. 15, 2013;
International Application No. PCT/US2013/000072, filed Mar. 15, 2013;
International Application No. PCT/US2013/000073, filed Mar. 15, 2013;
International Application No. PCT/US2013/000075, filed Mar. 15, 2013;
International Application No. PCT/US2013/000076, filed Mar. 15, 2013;
International Application No. PCT/US2013/000077, filed Mar. 15, 2013;
International Application No. PCT/US2013/000078, filed Mar. 15, 2013;
International Application No. PCT/US2013/000079, filed Mar. 15, 2013; and
International Application No. PCT/US2013/000081, filed Mar. 15, 2013.

The energy released by radioactive decay is much greater than the energy released by chemical reactions. Nuclear batteries take advantage of the energy density of radioisotopes and overcome some of the deficiencies of conventional electrochemical batteries (e.g., alkaline batteries, nickel-metal hydride batteries, etc.), such as limited energy content, sensitivity to environmental conditions, and relatively short useful life. Nuclear batteries typically have higher unit costs than conventional electrochemical batteries and have greater safety concerns.

Nuclear batteries are either indirect or direct energy conversion devices. In indirect conversion devices, radiation energy is converted to light or heat, which is then converted to electricity (e.g., by a photovoltaic cell or a thermopile). In direct conversion devices, radiation energy is converted directly to electricity without any intervening conversions.

In a direct-conversion nuclear battery, a radiation source emits radiation that is received by a doped semiconductor material having a p-n junction. The radiation (typically beta particles) causes a change in the electric potential of the doped semiconductor material, which can provide an electric potential to a load electrically connected to the doped semiconductor material. Radiation penetrates one semiconductor material and passes the junction into the other semiconductor material.

Some nuclear batteries include Schottky barriers. Schottky barriers include a semiconductor layer coated with a metallic layer, the junction between the layers having rectifying characteristics. For example, Schottky barriers are described in U.S. Pat. No. 5,859,484, issued Jan. 12, 1999, and titled "Radioisotope-Powered Semiconductor Battery;" in F. K. Manasse et al., "Schottky Barrier Betavoltaic Battery," *IEEE Transactions on Nuclear Science*, Vol. NS-23, No. 1, pp. 860-70 (February 1976); and in Jasprit Singh, *Semiconductor devices: Basic Principles*, 221-244 (Wiley 2001). In a nuclear battery having a Schottky barrier, current flows when the Schottky barrier is excited by radiation. Schottky barriers directly convert the energy of decay particles into electricity.

One of the key issues in direct-conversion nuclear batteries is the fraction of the decay particles striking the conversion device. The efficiency of direct-conversion devices tends to be limited because the decay products disperse in all directions. Because decay particles can be emitted in any direction, the fraction of the decay particles striking the conversion device depends on the geometry of the conversion device and the location of the radioactive source. For example, the probability of any particular decay particle's striking a planar surface near the radioactive element is less than 50%. The term "capture efficiency" of a conversion device is used herein to describe the fraction of decay particles leaving a radiation source that interacts with that conversion device. Energy of particles leaving a radiation source that do not interact with the conversion device is neither collected nor converted.

Conversion devices have been developed with various geometries to increase the capture efficiency. Such geometries include contoured surfaces, and channels, holes, grooves, and corrugations in the surfaces of the conversion device. U.S. Pat. No. 5,396,141, issued Mar. 7, 1995, and titled "Radioisotope Power Cells," discloses a radiation source sandwiched between two semiconductor materials or contained within a trench defined by the semiconductor materials. The trench is configured to have an aspect ratio of approximately 20:1 to increase the likelihood of any particular radioactive particle impinging on the semiconductor material. It would be advantageous to provide a nuclear battery having a conversion device with a higher capture efficiency and therefore a higher overall conversion efficiency than is currently available.

DISCLOSURE

This disclosure describes primary voltaic sources that include nanofiber Schottky barrier arrays and a radioactive source including at least one radioactive element configured to emit radioactive particles. The nanofiber Schottky barrier arrays have a semiconductor component and a metallic component joined at a metal-semiconductor junction. The metal and semiconductor materials are complimentary components, which together form the metal-semiconductor junction of the Schottky barrier. The radioactive source is positioned proximate to the nanofiber Schottky barrier arrays such that at least a portion of the radioactive particles impinge on the nanofiber Schottky barrier arrays to produce a flow of electrons across the metal-semiconductor junction.

Nanofibers may form either the semi-conductor component or the metallic component in the nanofiber Schottky barrier arrays. Nanofibers serve as the substrate upon which a complementary material is deposited to form the Schottky barrier arrays.

Methods of producing these primary voltaic sources include, for example, reacting at least one carbon oxide and a reducing agent, such as hydrogen, methane, or mixtures thereof, in the presence of a substrate comprising a catalyst to form a solid carbon product (e.g., a carbon nanofiber or an array of carbon nanofibers) over the substrate. The resulting solid carbon product is typically a semiconductor material. A complementary metallic material is disposed over at least a portion of the solid carbon product to form a nanofiber Schottky barrier array having a semiconductor component and a metallic component joined at a metal-semiconductor junction. If a metallic species of nanofiber is used, such as a metallic chirality of single-wall CNT, then a semiconductor is deposited on the surface of the nanofiber to form the metal-semiconductor junction. A radioactive source is disposed adjacent the nanofiber Schottky barrier array such that at least a portion of radioactive particles leaving the radioactive source impinge on the nanofiber Schottky barrier array to produce a flow of electrons across the metal-semiconductor junction.

DETAILED DESCRIPTION

Figure 1:
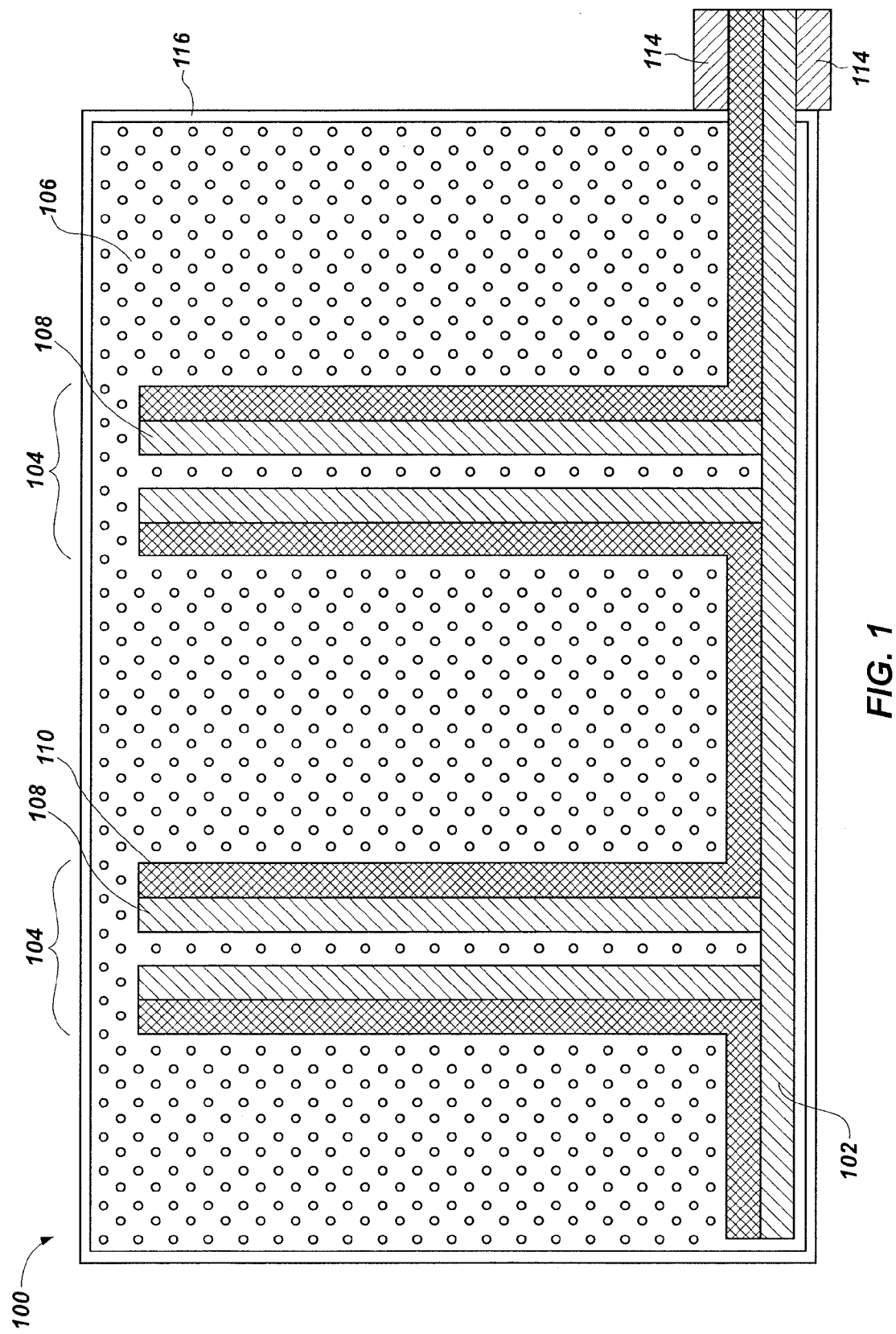
FIGS. 1 through 7 are schematic views of various embodiments of voltaic sources.

This disclosure describes primary voltaic sources including nanofiber Schottky barrier arrays and radioactive sources. Methods for forming such voltaic sources are also disclosed. The radioactive sources are positioned proximate to the nanofiber Schottky barrier arrays such that radioactive particles impinge on the nanofiber Schottky barrier arrays to produce mobile carriers in the nanofiber Schottky barrier arrays. The mobile carriers are converted to electrical energy when leads are connected to the nanofiber Schottky barrier arrays. The nanofiber Schottky barrier arrays or portions thereof may be formed by the reaction of carbon oxides (e.g., effluent from an industrial process or derived from the atmosphere) with hydrogen or hydrogen-containing reducing agents (e.g., methane, gaseous alkanes, alcohols, etc.).

As used herein, the term "primary voltaic source" means and includes a source of electrical energy that does not require charging or recharging. That is, regeneration of such a primary voltaic source may not be performed by simply applying a current. Formation of a primary voltaic source need not require input of electrical current to the primary voltaic source. Primary voltaic sources may be regenerated by replacing one or more components.

As used herein, the term "carbon oxide" means and includes carbon monoxide, carbon dioxide, and any combination of carbon monoxide, carbon dioxide, and one or more other materials (e.g., reducing agent or nitrogen).

As used herein, the term "reducing agent" means and includes hydrogen or hydrogen-containing reducing agents, such as methane, gaseous alkanes, alcohols, etc., and any combination thereof. Reducing agents optionally include one or more other materials (e.g., nitrogen or common constituents of syngas).

As used herein, the term "catalyst" means and includes a material formulated to promote one or more reactions described herein, resulting in the formation of a nanofiber component. A portion of a catalyst may be removed from a surrounding portion of the catalyst during the reaction and contained in or adhered to the solid carbon product. Thus, some of the catalyst may be physically removed during the reaction, and the catalyst may need to be continually replenished. The portion of the catalyst may not therefore be considered a catalyst in the classical sense, but is nonetheless referred to herein and in the art as a "catalyst" if the reaction is not believed to alter chemical bonds of the material forming the catalyst. Particularly useful catalysts for forming carbon-based nanofiber include, for example, iron, nickel, cobalt, etc., and alloys and mixtures thereof, as described herein, and are well known to promote Bosch reaction chemistries.

As used herein, the term "nanofiber" means and includes any substance with a characteristic diameter of less than approximately 100 nm and with an aspect ratio of greater than approximately 10:1. Nanofibers may include nanofibers such as carbon nanofibers or silicon nanofibers, nanotubes such as carbon nanotubes (CNTs) or other such filamentous materials as can formed from a wide variety of elements and compounds thereof. Nanofibers can be formed of materials with a wide variety of chemistries. For the purposes of this disclosure, specific methods for forming the nanofibers as carbon nanofibers or carbon nanotubes are described. This is not intended as a limitation on the generality of the disclosure, but rather is used for illustration of a specific embodiment.

Voltaic sources 100, 200, 300, 400 are shown schematically in FIGS. 1 through 4 as radioisotope-powered nanofiber Schottky barrier batteries. The voltaic sources 100, 200, 300, 400 each include a substrate 102, 302 and nanofiber Schottky barrier arrays 104, 204, 304, 404 having at least one degree of confinement. That is, a radioactive source 106 disposed adjacent the nanofiber Schottky barrier arrays 104, 204, 304, 404 is surrounded on at least two opposing sides by the nanofiber Schottky barrier arrays 104, 204, 304, 404. The radioactive source 106 is configured and adapted to cause the nanofiber Schottky barrier arrays 104, 204, 304, 404 to produce electrical energy, as described in further detail below.

The nanofiber Schottky barrier arrays 104, 204, 304, 404 each include a potential barrier having rectifying characteristics formed at a metal-semiconductor junction. That is, the nanofiber Schottky barrier arrays 104, 204, 304, 404 each include a semiconductor component and a metallic component. A wide variety of materials are suitable for use as the semiconductor component or the metallic component. Nanofiber Schottky barrier arrays 104, 204, 304, 404 are constructed as nanofibers 108, 308, such as CNTs.

Some nanofibers 108, 308 exhibit metallic or semiconductor properties. Without being bound to a particular theory, it is believed that arrangement of carbon atoms in a CNT affects properties of the CNT. For example, as described in Mildred S. Dresselhaus & Phaedon Avouris, *Introduction to Carbon Materials Research*, in CARBON NANOTUBES: SYNTHESIS, STRUCTURE, PROPERTIES, AND APPLICATIONS, 1, 6 (Mildred S. Dresselhaus, Gene Dresselhaus, & Phaedon Avouris, eds., 2001), the entire contents of which are incorporated herein by this reference, the diameter and chiral angle of a CNT are believed to affect whether the CNT has metallic or semiconductor properties. Such nanofibers 108, 308 therefore constitute either the semiconductor component or the metallic component of the nanofiber Schottky barrier arrays 104, 204, 304, 404. A nanofiber 108 having semiconductor properties is coated with a metal; a nanofiber 308 having metallic properties is coated with a semiconductor. Either arrangement provides a metal-semiconductor junction for the formation of a Schottky barrier. Many different combinations of nanofibers and applied complementary materials will readily occur to the skilled practitioner. Examples of other nanofibers that may be employed include silicon, boron, boron carbide, silicon carbide, aluminum, gadolinium, titania, etc.

FIG. 1 shows a voltaic source 100 with nanofiber Schottky barrier arrays 104 that include nanofibers 108 having semiconductor properties and a metallic coating 110 over at least a portion of the nanofibers 108. A Schottky barrier between the metallic coating 110 and the nanofiber 108 acts as a diode to allow current to flow primarily or entirely in one direction. Schottky barriers are described in, for example, U.S. Pat. No. 6,855,593, issued Feb. 15, 2005, and titled "Trench Schottky Barrier Diode," the entire contents of which are incorporated herein by this reference. For example, current may flow from the nanofiber 108 to the metallic coating 110. The voltaic source 100 includes terminals 114 to which a load may be connected. A container 116 optionally encloses the substrate 102, the nanofiber Schottky barrier array 104, the radioactive source 106, and/or the terminals 114.

The container 116, if present, may be configured to confine gaseous or liquid material including radionuclides, shield surroundings from radiation, or provide protection and mounting support for the components of the voltaic source 100. For example, the container 116 may provide sufficient shielding such that decay particles do not adversely affect the service environment or users of the voltaic source 100. Suitable containers for a particular application may be determined by the form of the nanofiber Schottky barrier arrays 104 and the radioactive source 106, the type and magnitude of radiation emitted by the radioactive source 106, environmental conditions, electrical connection requirement, etc.

As shown in FIG. 1, the nanofibers 108 may be CNTs secured to the substrate 102. For example, CNTs may be grown on a catalyst substrate, as described in U.S. Patent Publication No. 2012/0034150 A1. Nanofibers 108, as shown in FIG. 1, may be hollow, and the metallic coating 110 may coat an outside surface of the nanofibers 108. Thus, the radioactive source 106 may be disposed on the inside and the outside of the nanofibers 108. In other embodiments, the nanofibers 108 may not be hollow. In some embodiments, the nanofibers 108 have the same chemical composition as the substrate 102 and are integrated with the substrate 102. The nanofibers 108 may be in electrical contact with the substrate 102; that is, each nanofiber 108 may form an electrically conductive contact site with the substrate 102.

Figure 2:
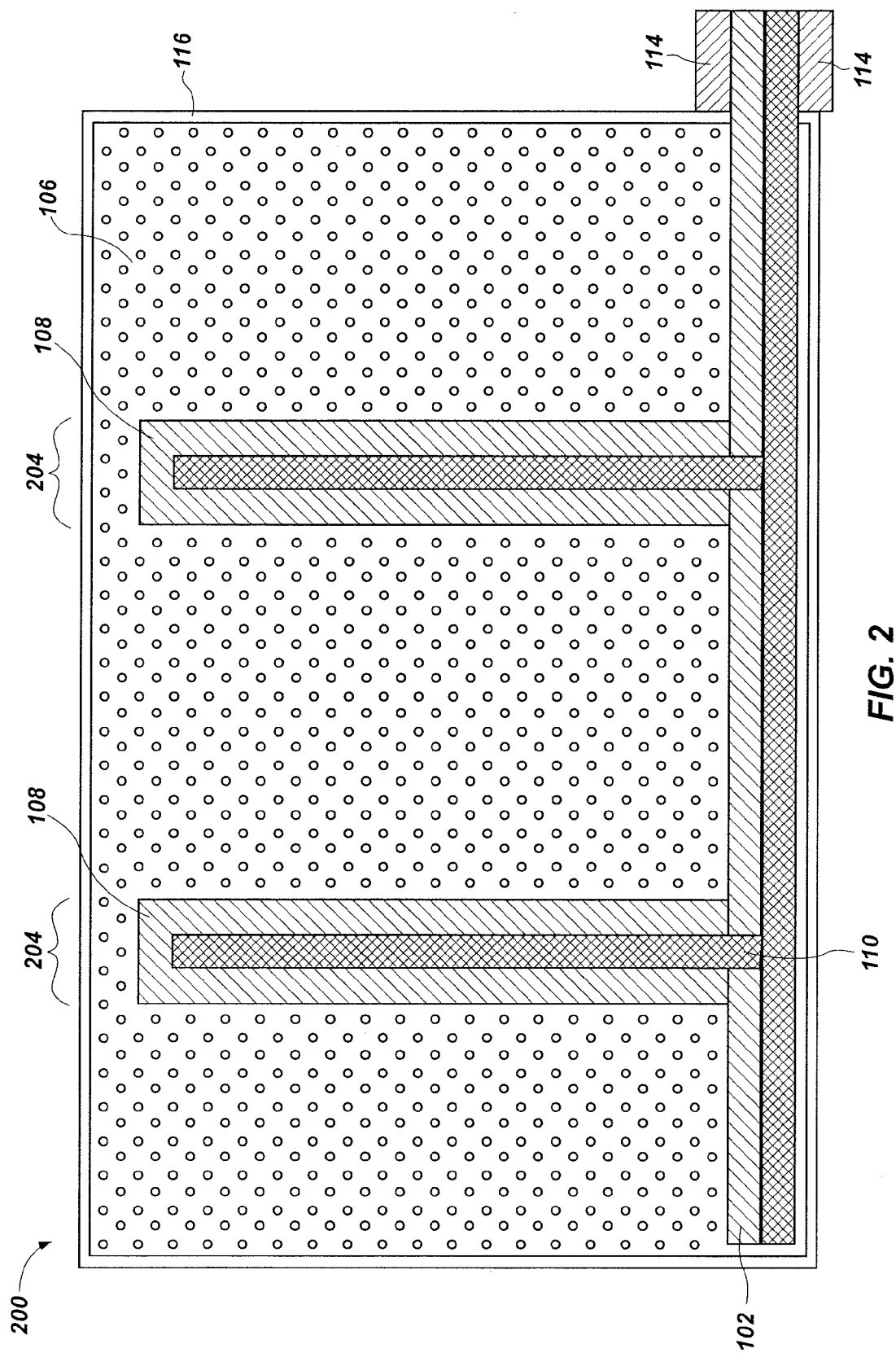

FIG. 2 illustrates another voltaic source 200 having nanofiber Schottky barrier arrays 204 and a radioactive source 106. Like the nanofiber Schottky barrier arrays 104 of FIG. 1, the nanofiber Schottky barrier arrays 204 include nanofibers 108 having semiconductor properties and a metallic coating 110 coating the nanofibers 108. However, the metallic coating 110 shown in FIG. 2 coats the inside surface of the nanofibers 108 instead of the outside surface. The radioactive source 106 shown in FIG. 2 is disposed only outside of the nanofibers 108. The voltaic source 200 includes terminals 114 to which a load may be connected. The metallic coating 110 may partially or completely fill cavities of the nanofibers 108. A container 116 optionally encloses the substrate 102, the nanofiber Schottky barrier arrays 204, the radioactive source 106, and/or the terminals 114.

Figure 3:
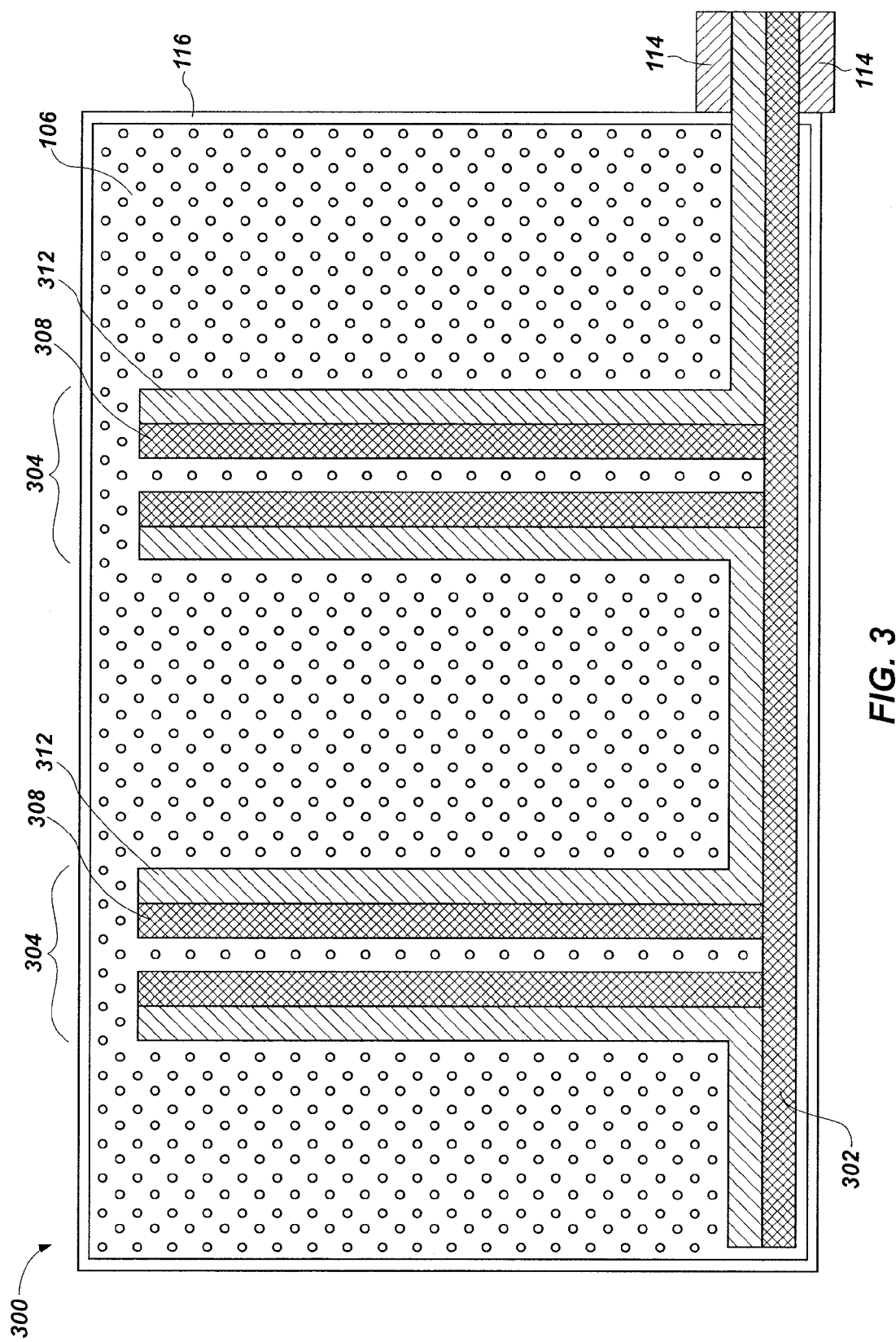

FIG. 3 illustrates another voltaic source 300 having nanofiber Schottky barrier arrays 304 and a radioactive source 106. Like the nanofiber Schottky barrier arrays 104 of FIG. 1, the nanofiber Schottky barrier arrays 204 each include nanofibers 308. However, the nanofibers 308 have metallic properties. A semiconductor coating 312 covers the outside surface of the nanofibers 308. The radioactive source 106 is disposed on the inside and the outside of the nanofibers 308. The voltaic source 300 includes terminals 114 to which a load may be connected. A container 116 optionally encloses the substrate 302, the nanofiber Schottky barrier arrays 304, the radioactive source 106, and/or the terminals 114.

Figure 4:
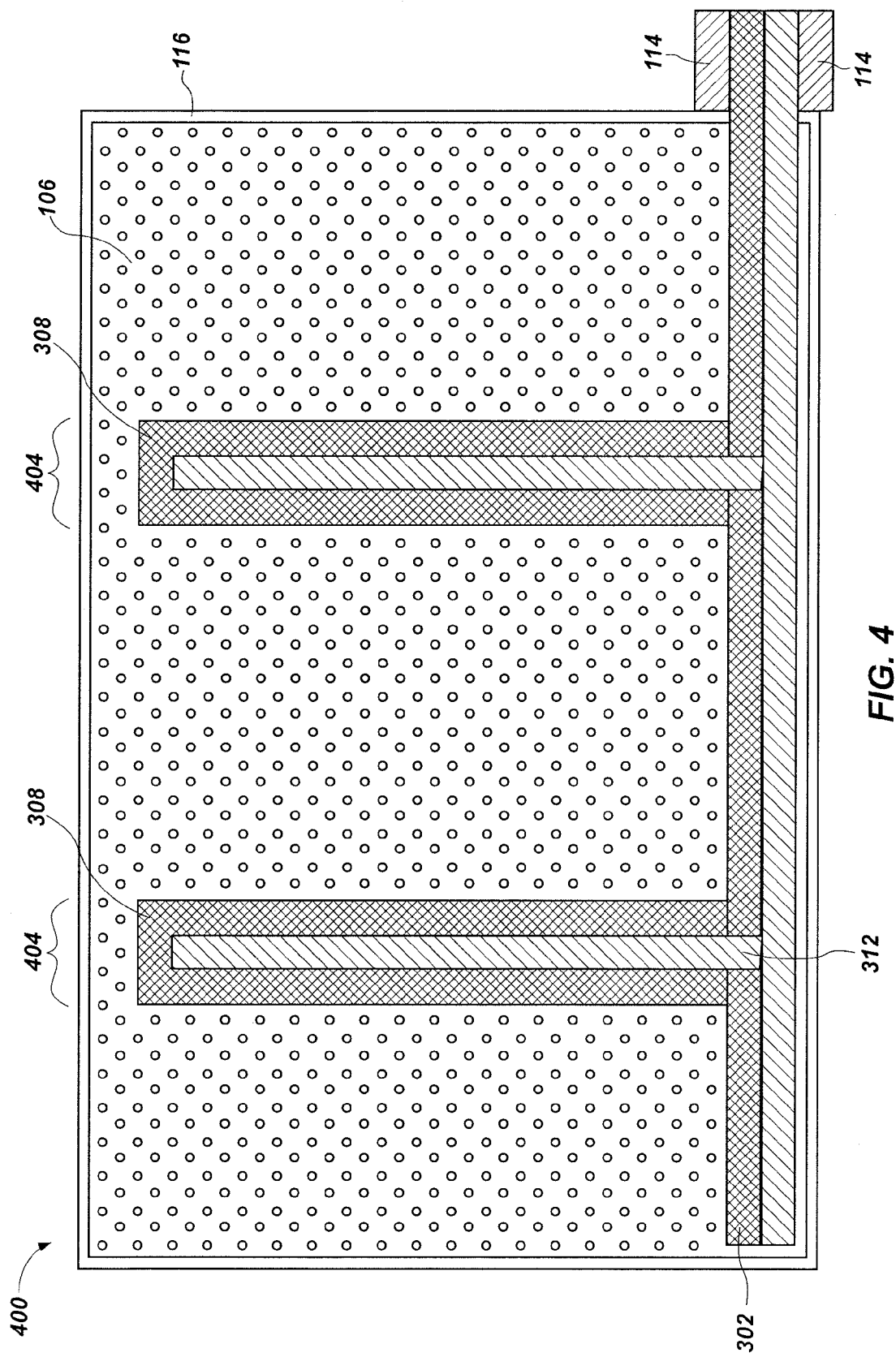

FIG. 4 illustrates another voltaic source 400 having nanofiber Schottky barrier arrays 404 and a radioactive source 106. Like the nanofiber Schottky barrier arrays 304 of FIG. 3, the nanofiber Schottky barrier arrays 404 each include a nanofiber 308 having metallic properties and a semiconductor coating 312. However, the semiconductor coating 312 shown in FIG. 4 coats the inside surface of the nanofiber 308, instead of the outside surface. The radioactive source 106 is disposed only on the outside of the nanofibers 308. The voltaic source 400 includes terminals 114 to which a load may be connected. The semiconductor coating 312 may partially or completely fill cavities of the nanofibers 308. A container 116 optionally encloses the substrate 302, the nanofiber Schottky barrier arrays 404, the radioactive source 106, and/or the terminals 114.

As shown above in FIGS. 1 through 4, the substrate 102, 302 and nanofibers 108, 308 can be either the metallic or the semiconductor component of the nanofiber Schottky barrier arrays 104, 204, 304, 404. The coating 312 is a semiconductor if the nanofibers 308 are metal; the coating 110 is a metal if the nanofibers 108 are a semiconductor. The resulting coated assemblies are the nanofiber Schottky barrier arrays 104, 204, 304, 404. The nanofiber Schottky barrier arrays 104, 204, 304, 404 are direct-conversion devices that convert decay energy of radioisotopes of the radioactive source 106 into electricity for the voltaic sources 100, 200, 300, 400.

The nanofiber Schottky barrier arrays 104, 204, 304, 404 may, in some embodiments, define voids near the nanofiber Schottky barrier arrays 104, 204, 304, 404. For example, the nanofibers 108 of the nanofiber Schottky barrier arrays 104 of FIG. 1 define hollow channels, and the nanofiber Schottky barrier arrays 104 together define a volume between adjacent nanofiber Schottky barrier arrays 104. The radioactive source 106 at least partially fills these voids.

The materials of the nanofiber Schottky barrier arrays 104, 204, 304, 404 form electron-hole pairs upon exposure to energy. That is, some electrons of the semiconductor material of the nanofiber Schottky barrier arrays 104, 204, 304, 404 absorb energy and transition from the valence band to the conduction band. In the voltaic sources 100, 200, 300, 400, the radioactive source 106 provides energy to form the electron-hole pairs. The radioactive source 106 provides alpha, beta, and/or gamma radiation from a radioisotope. The radioactive source 106 has a material including at least one radionuclide, such as tritium (hydrogen-3), beryllium-10, carbon-14, silicon-32, phosphorous-32, cobalt-60, krypton-85, strontium-90, cesium-137, promethium-147, americium-241, radium-226, lead-210, polonium-210, radium-228, actinium-227, thorium-228, uranium-234, uranium-235, curium-242, curium-244, and mixtures thereof. In some embodiments, the radioactive source 106 may include a source of beta particles produced from neutron-induced fission, as described in U.S. Patent Application Pub. No. 2013/0154438, published Jun. 20, 2013, and titled "Power- Scalable Betavoltaic Battery," the entire disclosure of which is hereby incorporated by reference. The selection of an appropriate radioactive source 106 depends on the metallic component and the semiconductor component of the nanofiber Schottky barrier arrays 104, 204, 304, 404.

The nanofiber Schottky barrier arrays 104, 204, 304, 404 may be exposed to a radioactive source 106 containing one radioisotope or mixture of radioisotopes, and the radioisotopes may be components of chemical compounds. For example, the radioactive source 106 may include tritium, tritium gas, tritiated water, or tritium bound within an organic or inorganic material. Additionally, the radioisotope may be incorporated into the material of the nanofiber Schottky barrier arrays 104, 204, 304, 404 by migration of the radioisotope into the nanofibers 108, 308, or may be a part of the chemical structure of the nanofiber Schottky barrier arrays 104, 204, 304, 404 (i.e., chemically bound to the metal or semiconductor of the nanofiber Schottky barrier arrays 104, 204, 304, 404).

The particular application for which the voltaic source 100, 200, 300, 400 is designed influences the radioisotope or mixture of radioisotopes selected for the radioactive source 106. As described in U.S. Pat. No. 5,008,579, issued Apr. 16, 1991, and titled "Light Emitting Polymer Electrical Energy Source," the entire contents of which are incorporated herein by this reference, a longer half-life correlates with a lower average beta energy for beta-emitting radioisotopes. The power output of the voltaic source 100, 200, 300, 400 may be a direct function of the energy output of the radioactive source 106. The half-life of the radioactive source 106 may therefore correlate to the effective lifetime of the voltaic source 100, 200, 300, 400. That is, for a given molecular weight, high-energy emitters will provide greater power densities. However, high-energy particles can damage the structure of the nanofiber Schottky barrier arrays 104, 204, 304, 404, reducing useful life of the voltaic source 100, 200, 300, 400. Thus, the voltaic source 100, 200, 300, 400 may be designed to balance power density with useful life. Tritium and americium-241 are examples of low-energy emitters that give relatively long battery life at relatively low power densities.

The output and lifetime of the voltaic source 100, 200, 300, 400 is also a function of the mixture of radioisotopes in the radioactive source 106. The energy spectrum of the incident particles for the materials of the nanofiber Schottky barrier arrays 104, 204, 304, 404 may be tailored to increase efficiency by including a mixture of two or more radioisotopes. Similarly, the materials of the nanofiber Schottky barrier arrays 104, 204, 304, 404 may be chosen to respond to the various peaks or energy spectrum regions of the radioisotopes of the radioactive source 106.

The materials of the radioactive source 106 may be selected to include a low-energy particle emitter. For example, the radioactive source 106 may emit particles having an energy of less than about 1.0 MeV, less than about 0.2 MeV, less than about 0.1 MeV, or even less than about 0.05 MeV. The radioactive source 106 may include any atoms that emit ionizing radiation, such as tritium, beryllium-10, carbon-14, silicon-32, phosphorous-32, cobalt-60, krypton-85, strontium-90, cesium-137, promethium-147, americium-241, radium-226, lead-210, polonium-210, radium-228, actinium-227, thorium-228, uranium-234, uranium-235, curium-242, curium-244, and mixtures thereof.

The radioactive source 106 may be in the form of a gas, a liquid, a solid, a foam, or a gel suffusing interstices of the nanofiber Schottky barrier arrays 104, 204, 304, 404 or between the nanofiber Schottky barrier arrays 104, 204, 304, 404. In some embodiments, the radioactive source 106 is incorporated into the material of the nanofiber Schottky barrier arrays 104, 204, 304, 404. The radioactive source 106 may be integral to the nanofiber Schottky barrier arrays 104, 204, 304, 404. That is, radioisotopes may be a part of nanofibers 108, 308, the metallic coating 110, or the semiconductor coating 312. For example, the metallic coating 110 may include a tritiated metal. The radioactive source 106 may include a carbon foam, as described in U.S. Pat. No. 4,628,143, issued Dec. 9, 1986, and titled "Foamed Nuclear Cell," the entire contents of which are incorporated herein by this reference.

As shown in FIGS. 1 through 4, the nanofibers 108, 308 of the nanofiber Schottky barrier arrays 104, 204, 304, 404 may be extended outwardly from the substrate 102, 302. For example, the nanofibers 108, 308 may be perpendicular or substantially perpendicular to the substrate 102, 302. Optionally, the nanofibers 108, 308 may be disposed at an angle with respect to the substrate 102, 302. The nanofibers 108, 308 of adjacent nanofiber Schottky barrier arrays 104, 204, 304, 404 may be generally parallel to one other. The nanofibers 108, 308 may be formed of the same material as the substrate 102, 302, and there may be no discernible transition from the substrate 102, 302 to the nanofibers 108, 308.

In other embodiments, the nanofibers 108, 308 have a different material composition than the substrate 102, 302 to which the nanofibers 108, 308 are secured. For example, the substrate 102, 302 may be a catalyst upon which the nanofibers 108, 308 are formed. Though each of FIGS. 1 through 4 shows two nanofibers 108, 308 secured to each substrate 102, 302, the voltaic source 100, 200, 300, 400 may include any number and arrangement of nanofibers 108, 308. For example, hundreds, thousands, millions, or billions of nanofibers 108, 308 may be secured to a single substrate 102, 302. The nanofibers 108, 308 may be secured to a planar substrate 102, 302 in an ordered pattern, such as in a grid arrangement. In some embodiments, the nanofibers 108, 308 have a random arrangement on the substrate 102, 302.

Figure 5:
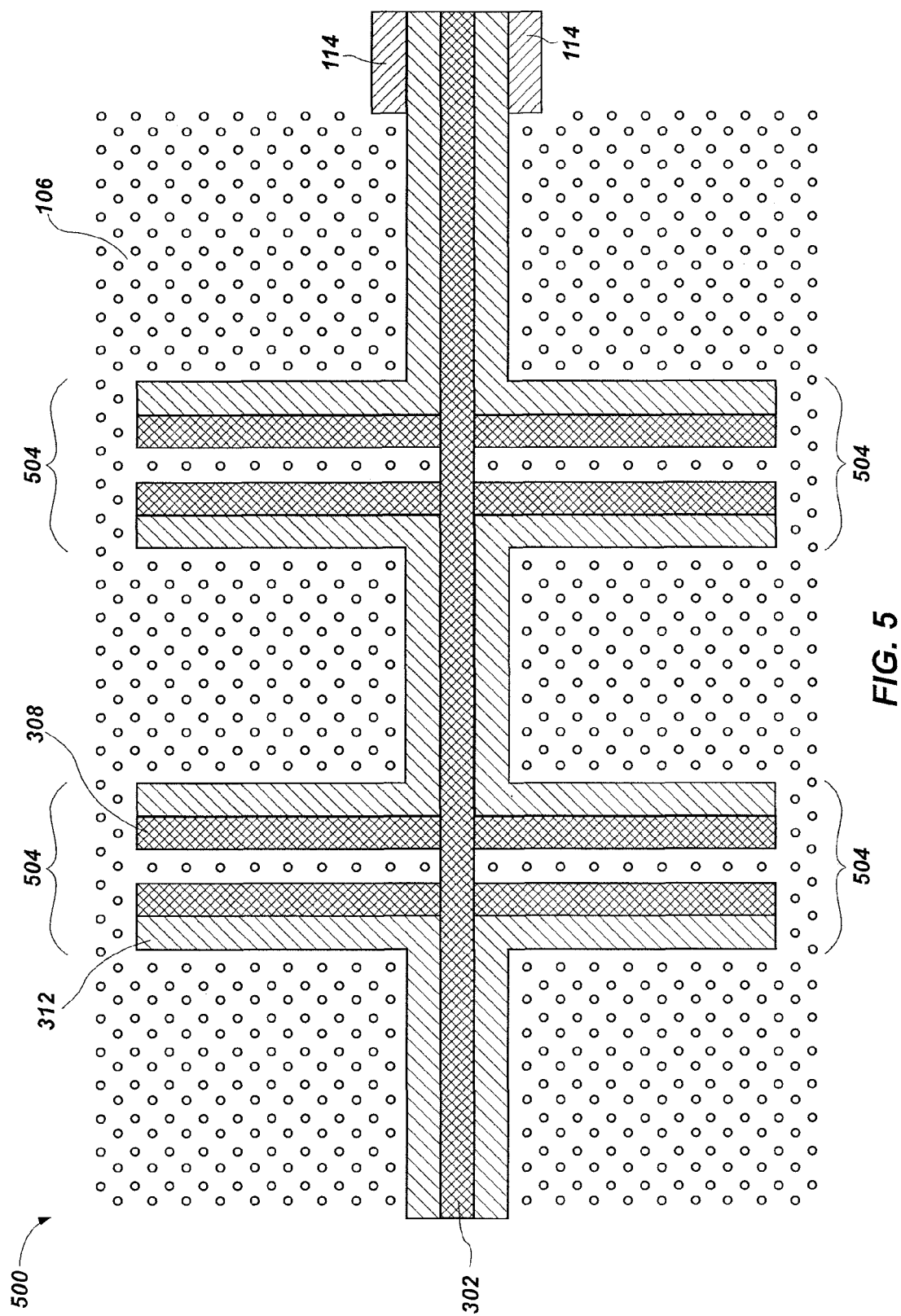

The voltaic sources 100, 200, 300, 400 shown in FIGS. 1 through 4 have nanofiber Schottky barrier arrays 104, 204, 304, 404 secured to one side of each substrate 102, 302. FIG. 5 illustrates another voltaic source 500 having nanofiber Schottky barrier arrays 504 secured to two opposite sides of a substrate 302. Like the nanofiber Schottky barrier arrays 304 of FIG. 3, the nanofiber Schottky barrier arrays 504 include nanofibers 308 having metallic properties and a semiconductor coating 312 on the nanofibers 308. The semiconductor coating 312 shown in FIG. 5 may be continuous or discontinuous. That is, the semiconductor coating 312 on one side of the substrate 302 may be connected to or distinct from the semiconductor coating 312 on the other side of the substrate 302. The semiconductor coatings 312 may be different materials. The radioactive source 106 may be disposed on the inside and the outside of the nanofibers 308. The voltaic source 500 includes terminals 114 to which a load may be connected. A container 116 (not shown in FIG. 5) optionally encloses the substrate 302, the nanofiber Schottky barrier arrays 504, the radioactive source 106, and/or the terminals 114.

Figure 6:
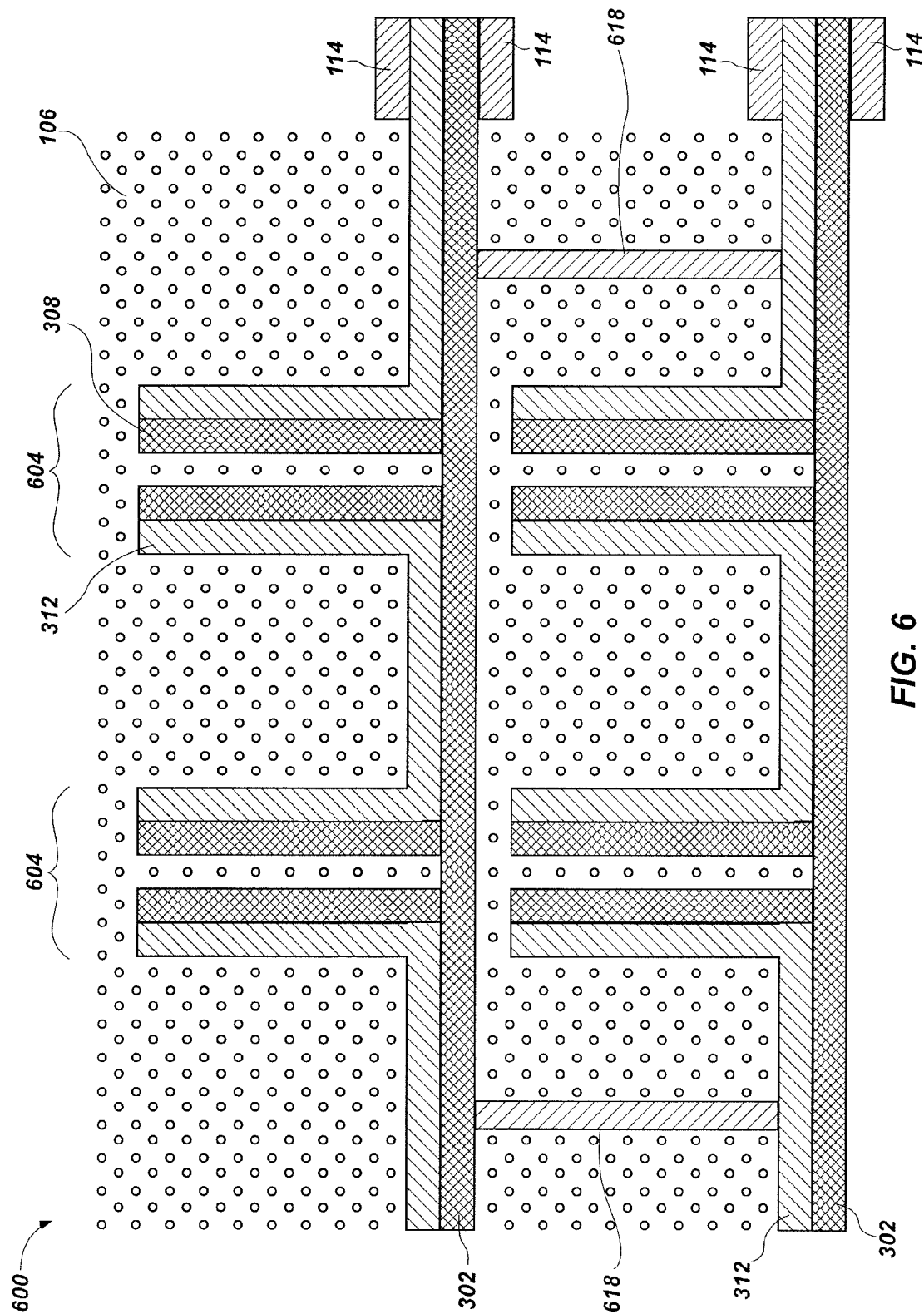

FIG. 6 illustrates another voltaic source 600 having nanofiber Schottky barrier arrays 604 secured to multiple substrates 302. Like the nanofiber Schottky barrier arrays 304 of FIG. 3, the nanofiber Schottky barrier arrays 604 include nanofibers 308 having metallic properties and a semiconductor coating 312 on the nanofibers 308. The substrates 302 may be connected to one another by one or more spacers 618. Two layers of substrates 302 are shown in FIG. 6, although any practical number of substrates 302 may be used. The substrates 302 of FIG. 6 are shown as generally parallel to one another. That is, a major surface of one substrate 302 (e.g., a surface to which the nanofibers 308 are secured) is generally parallel to a major surface of other substrates 302. The spacers 618 shown in FIG. 6 are longer than the nanofibers 308 connected to the lower substrate 302 (in the orientation of FIG. 6) to keep those nanofibers 308 from touching or shorting to the upper substrate 302 (in the orientation of FIG. 6). The spacers 618 may be conductive or nonconductive. The radioactive source 106 may be disposed on the inside and the outside of the nanofibers 308. The voltaic source 600 includes terminals 114 to which a load may be connected. A container 116 (not shown in FIG. 6) may enclose the substrate 302, the nanofiber Schottky barrier arrays 604, the radioactive source 106, and/or the terminals 114.

If each of the substrates 302 and the nanofiber Schottky barrier arrays 604 have the same configuration and composition, then two such substrates 302 produce double the power output of a single substrate 302 (i.e., double the voltage or double the current, depending on how the substrates 302 are connected to each other). The output of the voltaic source 600 can be further increased by increasing the number of substrates 302. The substrates 302 and the nanofiber Schottky barrier arrays 604 attached thereto may have different compositions, and may each be selected to respond to a selected radioactive source 106. For example, the radioactive source 106 may include two or more radioisotopes. A first radioisotope may be adjacent one substrate 302, and a second radioisotope may be adjacent a second substrate 302 of a different composition.

Figure 7:
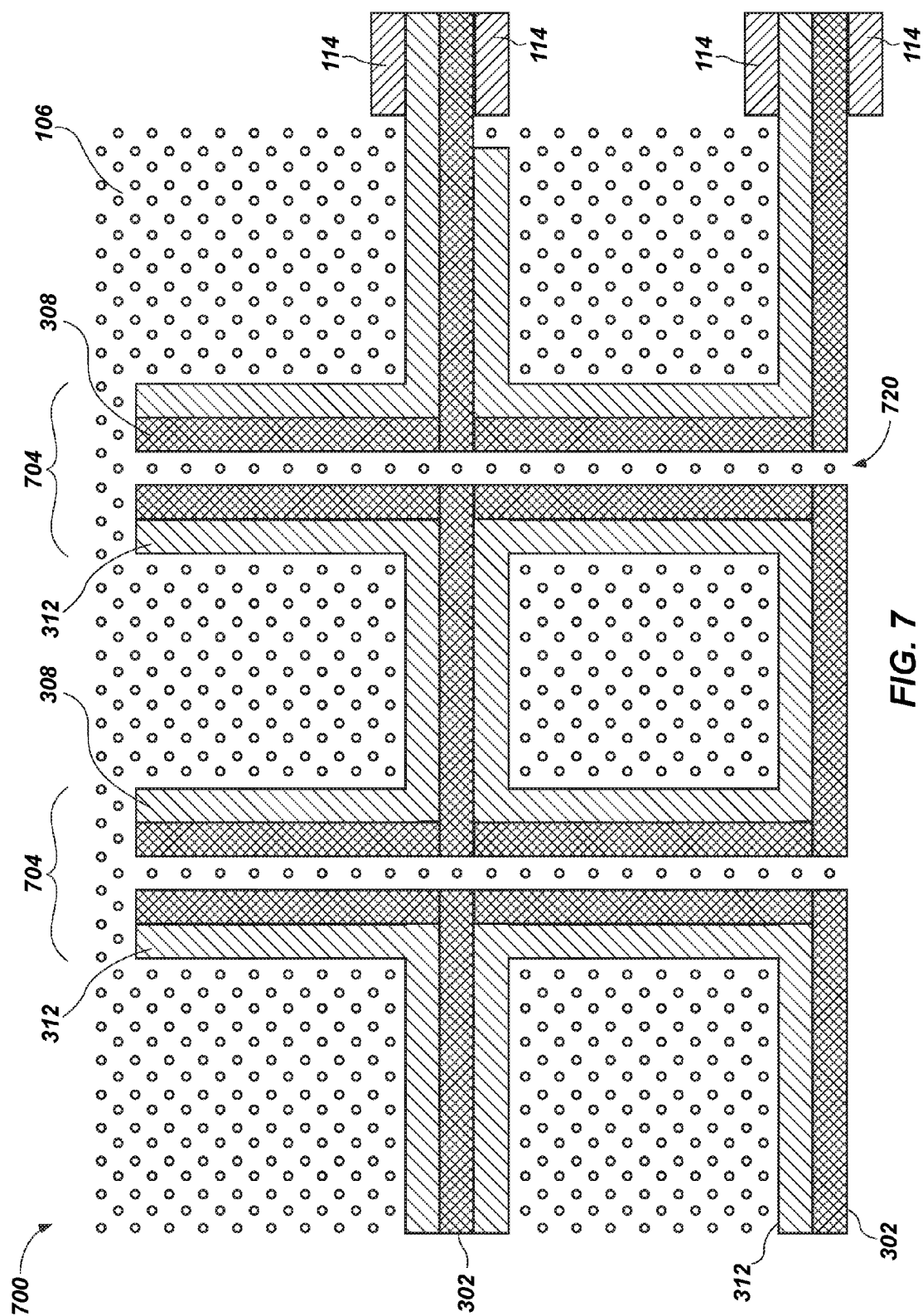

FIG. 7 illustrates another voltaic source 700 having nanofiber Schottky barrier arrays 704 secured to substrates 302. Like the nanofiber Schottky barrier arrays 304 of FIG. 3, the nanofiber Schottky barrier arrays 704 include nanofibers 308 having metallic properties and a semiconductor coating 312 on the nanofibers 308. The substrates 302 of FIG. 7 are connected to one another by nanofiber Schottky barrier arrays 704 such that the voltaic source 700 forms a wafer-type structure. Two layers of substrates 302 are shown in FIG. 7, although any practical number of substrates 302 may be present. The substrates 302 of FIG. 6 are shown as generally parallel to one another. The nanofibers 308 and the substrates 302 are interconnected by the nanofibers 308, and the semiconductor coating 312 is formed continuously over the nanofibers 308 and the substrates 302. In the embodiment shown in FIG. 7, each nanofiber 308 terminates at a hole 720 in the substrate 302. The hole 720 may have a linear dimension (e.g., a diameter or width) similar to a linear dimension of the nanofiber 308. The hole 720 may be formed by the nanofiber 308 lifting a portion of the substrate 302 as the nanofiber 308 is formed, as described in U.S. Patent Publication No. 2012/0034150 A1. The radioactive source 106 is disposed on the inside and the outside of the nanofibers 308.

In other embodiments, some nanofibers 308 may be closed at both ends, and the interiors thereof may be free of the radioactive source 106. In the cross-sectional schematic view of FIG. 7, a portion 722 of the radioactive source 106 appears entirely surrounded by the semiconductor coating 312, the substrates 302, and the nanofibers 308. However, the cross-sectional schematic view of FIG. 7 is simply a two-dimensional representation of a three-dimensional voltaic source 700. The nanofibers 308 are spaced apart from one another as shown in FIG. 7 and in a direction perpendicular to the view of FIG. 7. Therefore, the portion 722 of the radioactive source 106 is continuous with other portions of the radioactive source 106 shown. The voltaic source 600 includes terminals 114 to which a load may be connected. A container 116 (not shown in FIG. 7) optionally encloses the substrates 302, the nanofiber Schottky barrier arrays 704, the radioactive source 106, and/or the terminals 114.

The electrodes for the nanofiber Schottky barrier arrays 104, 204, 304, 404, 504, 604, 704 are the semiconductor and the metal surfaces. Terminals 114 (i.e., conductive pads) as shown in FIGS. 1 through 7 can be affixed to these surfaces anywhere on the surfaces to ease electrical connection to other devices, but terminals 114 are for convenience, and are not necessary to the operation of the voltaic sources 100, 200, 300, 400, 500, 600, 700. That is, a load may be connected directly to the substrate 102, 302, and to the metallic coating 110 or semiconductor coating 312. Thus, there may be no physical terminals 114, though electrical contact is still made between the nanofiber Schottky barrier arrays 104, 204, 304, 404, 504, 604, 704 and the load. Terminals 114 may be outside or inside the container 116. The electrical output of voltaic sources 100, 200, 300, 400, 500, 600, 700 is established across the metallic component and the semiconductor component the nanofiber Schottky barrier arrays 104, 204, 304, 404, 504, 604, 704.

Figure 8:
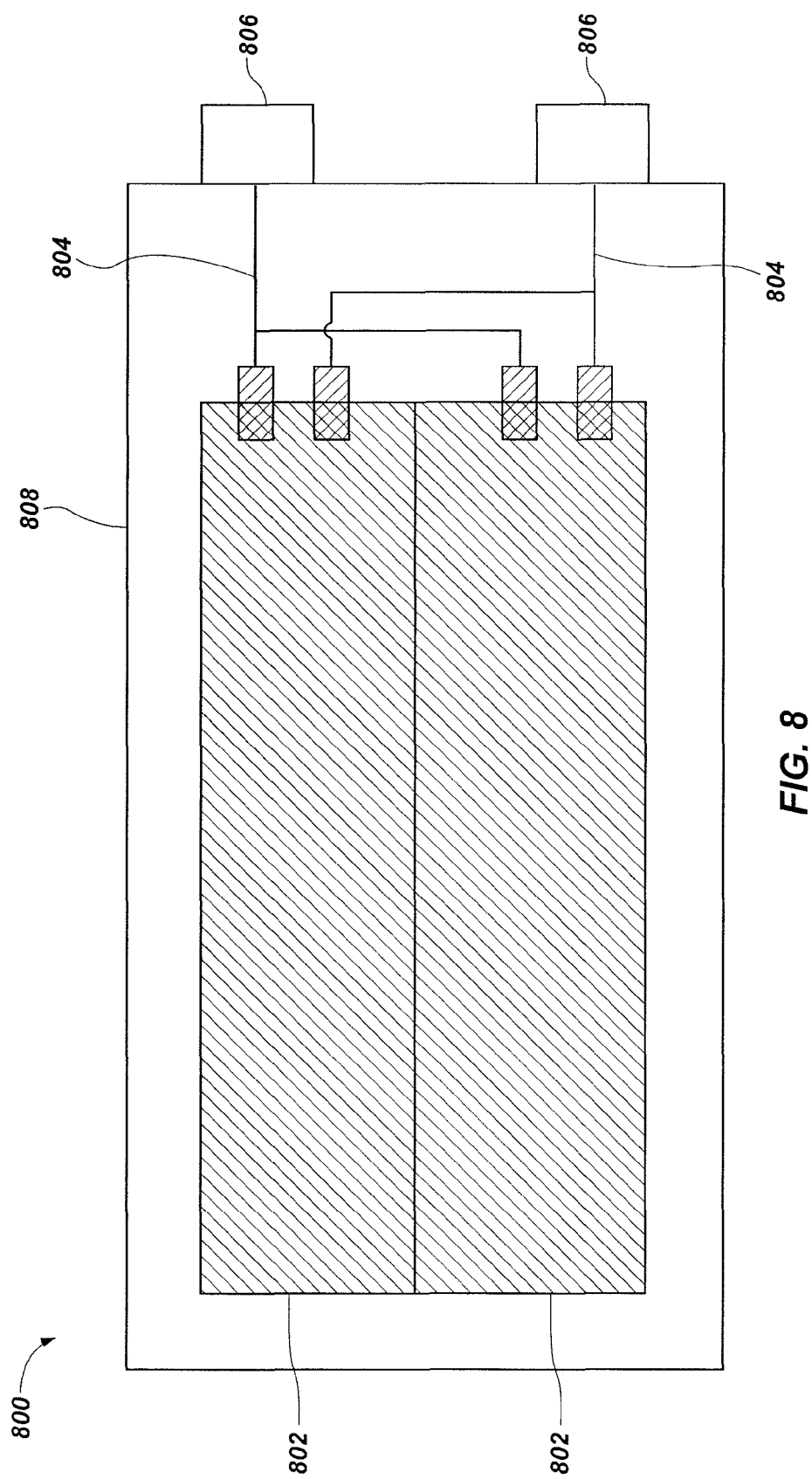
FIG. 8 is a schematic view of a battery including voltaic sources as described herein.

FIG. 8 illustrates a battery 800 including multiple voltaic sources 802 (which may be any combination of voltaic source 100, 200, 300, 400, 500, 600, 700). The voltaic sources 802 are connected in parallel by wires 804 to terminals 806. The voltaic sources 802 and the wires 804 are contained within a container 808. The container 808 may be, for example, a metal casing for a standard battery (e.g., an "AA" size battery, a lantern battery, a 9-volt consumer battery, a button-cell battery, etc.) or any other material capable of holding the voltaic sources 802 and the wires 804 in place. Though shown as distinct features in FIG. 8, the terminals 806 may be integral to the container 808. The wires 804 may alternately connect the voltaic sources 802 in series to provide a higher output voltage. The battery 800 may include other features, such as mounting hardware, cushioning material, shielding, etc., as known in the art.

Batteries including voltaic sources may have any selected size and shape. For example, a battery may include cylindrically formed nanofiber Schottky barrier arrays. In other embodiments, a planar substrate having nanofiber Schottky barrier arrays is rolled to fit a cylindrical battery container. In other embodiments, substrates having nanofiber Schottky barrier arrays are stacked to fit battery containers having the shape of a rectangular prism (e.g., the shape of a 9-volt consumer battery or an automotive battery). The substrates 102, 302 may be flexible such that the voltaic sources can be formed into a variety of configurations, depending on the application.

The nanofiber Schottky barrier arrays 104, 204, 304, 404, 504, 604, 704 can be formed from a wide variety of materials tuned to the type of radionuclides of the radioactive source 106. In all the voltaic sources 100, 200, 300, 400, 500, 600, 700, the nanofiber Schottky barrier arrays 104, 204, 304, 404, 504, 604, 704 each include nanofibers 108, 308 coated with a complimentary material. The nanofibers 108, 308 can be either semiconductor or metallic, with the complimentary material being a metallic coating 110 if the nanofibers 108 are of a semiconductor material, or a semiconductor coating 312 if the nanofibers 308 are metallic.

For example, the voltaic source 100 of FIG. 1 may be formed by connecting nanofibers 108 having semiconductor properties outwardly from the surface of the substrate 102, which also has semiconductor properties. For example, the nanofibers 108 may be formed perpendicular or substantially perpendicular to the substrate 102. Nanofibers 108, such as CNTs, may be formed as described in U.S. Patent Application Publication No. 2012/0034150 A1. In such methods, carbon oxides react with a reducing agent in the presence of a catalyst to form CNTs on the catalyst, for example by the Bosch reaction: $CO_2 + 2H_2 \leftrightarrow C_{(s)} + 2H_2O$. CNTs may also be formed by the reaction of carbon monoxide. Either carbon dioxide or carbon monoxide may react with other reducing agents, such as an alkane, an alcohol, etc.

Examples of suitable catalysts include elements of Groups 5 through 10 of the periodic table, actinides, lanthanides, alloys thereof, and combinations thereof. By selecting the catalyst and the reaction conditions, the process may be tuned to produce selected morphologies of CNTs, such as those having semiconductor properties. Most CNTs, including multi-wall CNTs, have semiconductor properties. Other selected conditions may produce CNTs having metallic properties. Some single-wall CNTs (i.e., single-wall CNTs of particular chiralities) are known in the art to have metallic properties.

The resulting semiconductor assembly can be coated with a metallic coating 110 by metal vapor deposition (e.g., physical vapor deposition, chemical vapor deposition, atomic layer deposition, etc.) to create the nanofiber Schottky barrier arrays 104 on the substrate 102. The entire assembly becomes a Schottky barrier material (i.e., the Schottky barrier extends from the tips of the nanofibers 108 to the substrate 102 and across the surface of the substrate 102 covered by the metallic coating 110). The substrate 102 may have the same chemical composition as the nanofibers 108 to promote uniformity of the electrical properties of the barrier. For example, the substrate 102 may be carbon having semiconductor properties; the substrate 102 would then have a catalyst deposited on the surface thereof. The nanofibers 108 may be CNTs grown from the catalyst, and may have semiconductor properties similar to the substrate 102. However, in some embodiments, the substrate 102 has a different composition from the nanofibers 108, as appropriate (e.g., to improve mechanical strength to the substrate 102).

As another example, the voltaic source 300 of FIG. 3 may be formed by connecting nanofibers 808 having metallic properties outwardly from to the surface of the substrate 302, which also has metallic properties. For example, the nanofibers 308 may be formed perpendicular or substantially perpendicular to the substrate 302. Nanofibers 308 may be formed as described above with reference to the nanofibers 108 of FIG. 1.

The resulting metallic assembly may be coated with a semiconductor coating 312 through a variety of methods, such as by vapor deposition (e.g., physical vapor deposition, chemical vapor deposition, atomic layer deposition, etc.) to create the nanofiber Schottky barrier arrays 304 on the substrate 302. For example, the semiconductor coating 312 may include GaAs, InP, $Al_xGa_{1-x}As$, $Ga_xIn_{(1-x)}As_yP_{(1-y)}$, GaInNAs, etc. The entire assembly becomes a Schottky barrier material (i.e., the Schottky barrier extends from the tips of the nanofibers 308 to the substrate 302 and across the surface of the substrate 302 covered by the semiconductor coating 312). The substrate 302 may have the same chemical composition as the nanofibers 308 to promote uniformity of the electrical properties of the barrier. However, in some embodiments, the substrate 302 has a different composition from the nanofibers 308 as appropriate (e.g., to improve mechanical strength to the substrate 302).

The nanofibers 108, 308 shown in FIGS. 1 through 7 can be formed or mounted on a substrate 102, 302 in such a way that they form an ordered array, such as a CNT forest, or in a random arrangement (e.g., like a shag carpet) within which a radioisotope can be suffused. The resulting nanofiber Schottky barrier arrays 104, 204, 304, 404, 504, 604, 704 have a very large capture efficiency for the interaction of the products of radioisotope decay with the nanofiber Schottky barrier arrays 104, 204, 304, 404, 504, 604, 704.

Voltaic sources 100, 200, 300, 400, 500, 600, 700 can be manufactured in sheets by starting with a first layer substrate 102, 302 upon which the nanofibers 108, 308 are grown or affixed. The nanofibers 108, 308 and the substrate 102, 302 are then coated by standard vapor deposition methods. The resulting sheet includes the nanofiber Schottky barrier arrays 104, 204, 304, 404, 504, 604, 704, and may be further processed by singulating, stacking, soldering, etc.

The radioactive source 106 may be disposed adjacent the nanofiber Schottky barrier arrays 104, 204, 304, 404, 504, 604, 704 by methods known in the art, such as those described in U.S. Pat. No. 5,396,141. The composition of the radioactive source 106 is selected based on design factors such as useful life, power output, type of radiation emitted, etc. In some embodiments, the radioactive source 106 is deposited as a solid or liquid onto surfaces of the nanofiber Schottky barrier arrays 104, 204, 304, 404, 504, 604, 704. In other embodiments, a gaseous radioactive source 106 (e.g., tritium) is suffused into and between nanofibers 108, 308.

Voltaic sources and batteries as described herein have many advantages over conventional nuclear batteries and other types of batteries, such as efficiency, ease of construction, low temperature dependence, etc. Because nanofibers 108, 308 typically have large specific surface area, the capture efficiency for the decay energy of the radionuclides of the radioactive source 106 are generally higher than for conventional nuclear-battery designs. The high capture efficiency of the voltaic source 100, 200, 300, 400, 500, 600, 700 is made possible by the tight packing and extremely high surface-area-to-volume ratio that is possible using nanomaterials such as CNTs, whether in an aligned forest or as randomly oriented Schottky barrier nanofibers 108. Specific surface areas of in excess of 100 $m^2/cm^3$ or even 1,000 $m^2/cm^3$ are possible. This leaves the radioactive source 106 filling the interstices between a plurality of the Schottky barrier nanofibers 108 substantially surrounded by surfaces capable of transforming at least a portion of the energy emitted by the radioactive source.

The nanofiber Schottky barrier arrays 104, 204, 304, 404, 504, 604, 704 may be construct by methods described in U.S. Patent Publication No. 2012/0034150 A1. The ease of construction reduces the cost of manufacture, and the increased efficiency reduces both the size and cost per unit power output. Voltaic sources 100, 200, 300, 400, 500, 600, 700 generally have lower temperature dependence than conventional voltage sources because radioactive emissions are less dependent on temperature than chemical reactions, and because efficiencies of nanofiber Schottky barrier arrays 104, 204, 304, 404, 504, 604, 704 are less dependent on temperature than efficiencies of conventional p-n diodes.

Voltaic sources 100, 200, 300, 400, 500, 600, 700 can be manufactured at a wide variety of scales. For example, voltaic sources 100, 200, 300, 400, 500, 600, 700 may be configured to power small devices that can be included in integrated circuits, embedded medical devices (e.g., pacemakers) and portable electronic devices (e.g., cell phones, tablet computers, etc.). Voltaic sources 100, 200, 300, 400, 500, 600, 700 may also power large devices, such as spacecraft, industrial equipment, offices, homes, etc.

Although the foregoing description contains many specifics, these are not to be construed as limiting the scope of the present disclosure, but merely as providing example embodiments. Similarly, other embodiments may be devised which do not depart from the scope of the present invention. For example, features described herein with reference to one embodiment also may be provided in others of the embodiments described herein. The scope of the invention is, therefore, indicated and limited only by the appended claims and their legal equivalents, rather than by the foregoing description. All additions, deletions, and modifications, as disclosed herein, which fall within the meaning and scope of the claims, are encompassed by the present invention.

What is claimed is:

1. A primary voltaic source, comprising:
 a Schottky barrier array comprising a semiconductor component and a metallic coating over the semiconductor component, the semiconductor component and the metallic coating joined at a metal-semiconductor junction, the semiconductor component comprising at least one selected from the group consisting of a semiconductor carbon nanotube and a carbon nanofiber, the Schottky barrier array defining a plurality of voids therein; and
 a radioactive source comprising at least one radioactive element configured to emit radioactive particles and positioned proximate to the Schottky barrier array such that at least a portion of the radioactive particles impinge on the Schottky barrier array to produce a flow of electrons across the metal-semiconductor junction, the radioactive source occupying at least a portion of the plurality of voids.

2. The primary voltaic source of claim 1, wherein the Schottky barrier array comprises a plurality of semiconductor carbon nanotubes, and wherein an interior surface of the plurality of semiconductor carbon nanotubes defines the voids.

3. The primary voltaic source of claim 1, where the radioactive source comprises at least one material selected from the group consisting of gases, liquids, solids, gels, and foams.

4. The primary voltaic source of claim 3, wherein the Schottky barrier comprises a plurality of semiconductor carbon nanotubes defining interstices, and wherein the radioactive source is disposed within the interstices.

5. The primary voltaic source of claim 1, wherein the Schottky barrier comprises a plurality of semiconductor carbon nanofibers and the metallic coating formed over the plurality of semiconductor nanofibers, wherein a first end of each semiconductor nanofiber is secured to a substrate.

6. The primary voltaic source of claim 5, wherein the plurality of semiconductor nanofibers comprises a first plurality and a second plurality of the semiconductor nanofibers, wherein the first plurality of semiconductor nanofibers is secured outwardly from a first side of the substrate and the second plurality of semiconductor nanofibers is secured outwardly from a second, opposite side of the substrate.

7. The primary voltaic source of claim 5, wherein each semiconductor nanofiber of the plurality comprises a material of the same type as a material of the substrate, and wherein each semiconductor nanofiber of the plurality forms an electrically conductive contact site with the substrate.

8. The primary voltaic source of claim 7, wherein the metallic coating formed over the plurality of nanofibers forms an electrically conducting continuous layer over at least a portion of each semiconductor nanofiber of the plurality and over at least a portion of the substrate.

9. The primary voltaic source of claim 5, wherein each semiconductor nanofiber of the plurality comprises a semiconductor carbon fiber nanotube with a metallic coating.

10. The primary voltaic source of claim 1, wherein:
 the Schottky barrier array comprises a first plurality of semiconductor nanofibers secured outwardly from a first substrate and a first metallic coating formed over the plurality of semiconductor nanofibers;
 the voltaic source comprises a second Schottky barrier array comprising a second plurality of semiconductor nanofibers secured outwardly from a second substrate and a second metallic coating formed over the second plurality of semiconductor nanofibers; and
 a major surface of the second substrate is oriented substantially parallel to a major surface of the first substrate.

11. The primary voltaic source of claim 1, wherein the radioactive source comprises at least one low-energy particle emitter.

12. The voltaic source of claim 11, wherein the at least one low-energy particle emitter is configured to emit particles having an energy of less than about 0.2 MeV.

13. The primary voltaic source of claim 1, wherein the radioactive source comprises at least one material selected from the group consisting of tritium, beryllium-10, carbon-14, silicon-32, phosphorous-32, cobalt-60, krypton-85, strontium-90, cesium-137, promethium-147, americium-241, radium-226, lead-210, polonium-210, radium-228, actinium-227, thorium-228, uranium-234, uranium-235, curium-242, and curium-244.

14. The primary voltaic source of claim 1, wherein the radioactive source comprises tritium and americium-241.

15. The primary voltaic source of claim 1, wherein the radioactive source is integrated with the metallic coating of the Schottky barrier array.

16. The primary voltaic source of claim 1, wherein the radioactive source is integrated with the semiconductor component of the Schottky barrier array.

17. A method for producing a primary voltaic source, comprising:
 reacting at least one carbon oxide and a reducing agent in the presence of a substrate comprising a catalyst to form a solid carbon product over the substrate;
 disposing a material over at least a portion of the solid carbon product to form a Schottky barrier array comprising a semiconductor component and a metallic coating over the semiconductor component, the semiconductor component comprising at least one selected from the group consisting of a semiconductor carbon nanotube and a carbon nanofiber, the semiconductor component and the metallic coating joined at a metal-semiconductor junction, the Schottky barrier array defining a plurality of voids therein; and
 disposing a radioactive source comprising at least one radioactive element configured to emit radioactive particles proximate to the Schottky barrier array such that the radioactive source occupies at least a portion of the plurality of voids and such that at least a portion of radioactive particles leaving the radioactive source impinge on the Schottky barrier array to produce a flow of electron across the metal-semiconductor junction.

18. The method of claim 17, wherein reacting at least one carbon oxide and a reducing agent comprises reacting carbon dioxide with a reducing agent comprising hydrogen, an alkane, or an alcohol.

19. The method of claim 17, wherein reacting at least one carbon oxide and a reducing agent comprises forming a solid carbon product having semiconductor properties.

20. The method of claim 19, wherein disposing a material over at least a portion of the solid carbon product comprises disposing the metallic coating over the solid carbon product.

21. The method of claim 17, wherein disposing a radioactive source proximate to the Schottky barrier array comprises disposing at least one material selected from the group consisting of tritium, beryllium-10, carbon-14, silicon-32, phosphorous-32, cobalt-60, krypton-85, strontium-90, cesium-137, promethium-147, americium-241, radium-226, lead-210, polonium-210, radium-228, actinium-227, thorium-228, uranium-234, uranium-235, curium-242, and curium-244 adjacent the Schottky barrier array.

* * * * *

UNITED STATES PATENT AND TRADEMARK OFFICE
CERTIFICATE OF CORRECTION

PATENT NO. : 9,779,845 B2
APPLICATION NO. : 13/943993
DATED : October 3, 2017
INVENTOR(S) : Dallas B. Noyes It is certified that error appears in the above-identified patent and that said Letters Patent is hereby corrected as shown below:

In the Specification
  Column 9,   Line 41,   change "704 such that the" to --704, such that the--

In the Claims
Claim 5,   Column 13,   Line 49,   change "barrier comprises a" to --barrier array comprises a--
Claim 5,   Column 13,   Line 50,   change "carbon nonfibers and" to --nanofibers and--
Claim 9,   Column 14,   Line 5,   change "carbon fiber nanotube" to --carbon nanotube--

Signed and Sealed this
Twentieth Day of March, 2018

Andrei Iancu
*Director of the United States Patent and Trademark Office*